US008416016B2

(12) United States Patent
Atsushi

(10) Patent No.: US 8,416,016 B2
(45) Date of Patent: Apr. 9, 2013

(54) APPARATUS AND METHOD FOR CONTROLLING A COMMON-MODE VOLTAGE OF SWITCHING AMPLIFIERS

(75) Inventor: Matamura Atsushi, Tokyo (JP)

(73) Assignee: Analog Devices, Inc., Norwood, MA (US)

( * ) Notice: Subject to any disclaimer, the term of this patent is extended or adjusted under 35 U.S.C. 154(b) by 118 days.

(21) Appl. No.: 12/818,039

(22) Filed: Jun. 17, 2010

(65) Prior Publication Data

US 2010/0253396 A1 Oct. 7, 2010

Related U.S. Application Data

(62) Division of application No. 11/599,840, filed on Nov. 15, 2006, now Pat. No. 7,772,924.

(51) Int. Cl.
*H03F 3/38* (2006.01)

(52) U.S. Cl.
USPC .............................................. 330/10; 330/251

(58) Field of Classification Search .................. 363/131, 363/132, 17, 21.01, 21.06, 37, 40, 41, 71, 363/98; 330/10, 270, 251, 207
See application file for complete search history.

(56) References Cited

U.S. PATENT DOCUMENTS

| 5,343,382 | A  * | 8/1994  | Hale et al. ....................... 363/98 |
| 5,410,592 | A    | 4/1995  | Wagner et al. |
| 6,211,728 | B1   | 4/2001  | Chen et al. |
| 6,262,632 | B1   | 7/2001  | Corsi et al. |
| 6,335,604 | B1 * | 1/2002  | Kataoka ....................... 318/609 |
| 6,472,993 | B1 * | 10/2002 | Addy ....................... 340/686.1 |
| 6,614,297 | B2   | 9/2003  | Score et al. |
| 6,735,302 | B1   | 5/2004  | Caine et al. |
| 6,778,009 | B1   | 8/2004  | Lee |
| 7,078,964 | B2   | 7/2006  | Risbo et al. |
| 7,262,658 | B2 * | 8/2007  | Ramaswamy et al. ........ 330/251 |
| 7,772,924 | B2   | 8/2010  | Matamura |
| 2002/0075068 | A1 | 6/2002  | Hsu |
| 2004/0161122 | A1 | 8/2004  | Nielsen |
| 2004/0227567 | A1 | 11/2004 | Llewellyn |
| 2005/0083116 | A1 * | 4/2005 | Risbo et al. ..................... 330/10 |
| 2008/0030267 | A1 | 2/2008  | Yang |

OTHER PUBLICATIONS

International Preliminary Report on Patentability in PCT/US2007/023893, dated May 19, 2009.
Written Opinion of the International Searching Authority in PCT/US2007/023893, dated May 15, 2009.

* cited by examiner

*Primary Examiner* — Nguyen Tran
(74) *Attorney, Agent, or Firm* — Knobbe Martens Olson & Bear LLP

(57) ABSTRACT

A system includes a modulator for receiving an input signal, modulating the received input signal, and generating a digital signal, an H-bridge controller for receiving the digital signal and generating control signals, an H-bridge circuit for receiving the control signals and operating based on the received control signals so as to output an analog signal to a load, and a common-mode error determination circuit for generating an error signal indicating at least one of an error of a common-mode voltage and an error of a common-mode current of the H-bridge circuit. The H-bridge controller receives the error signal and generates the control signals based on the received digital signal and the received error signal so as to reduce variations in at least one of an average of the common-mode voltage or an average of the common-mode current of the H-bridge circuit.

24 Claims, 13 Drawing Sheets

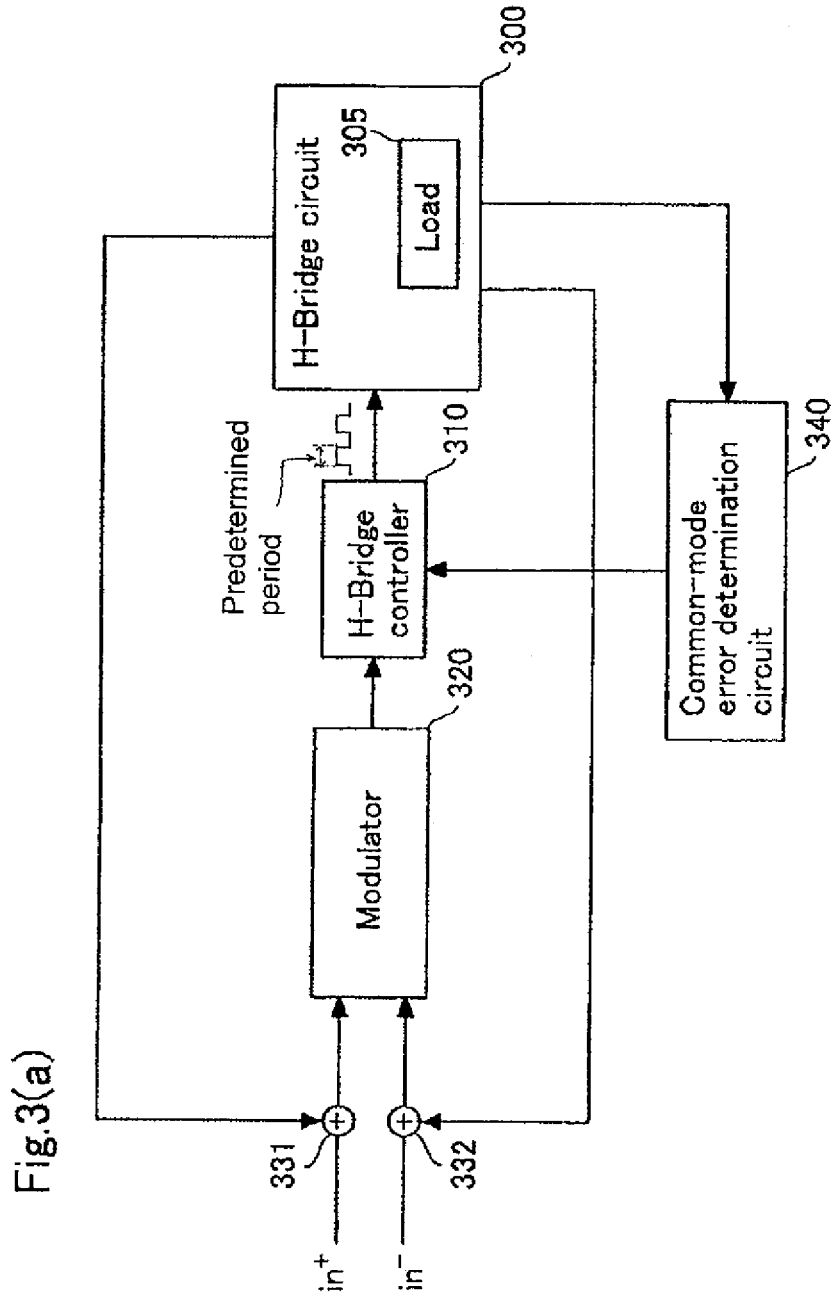

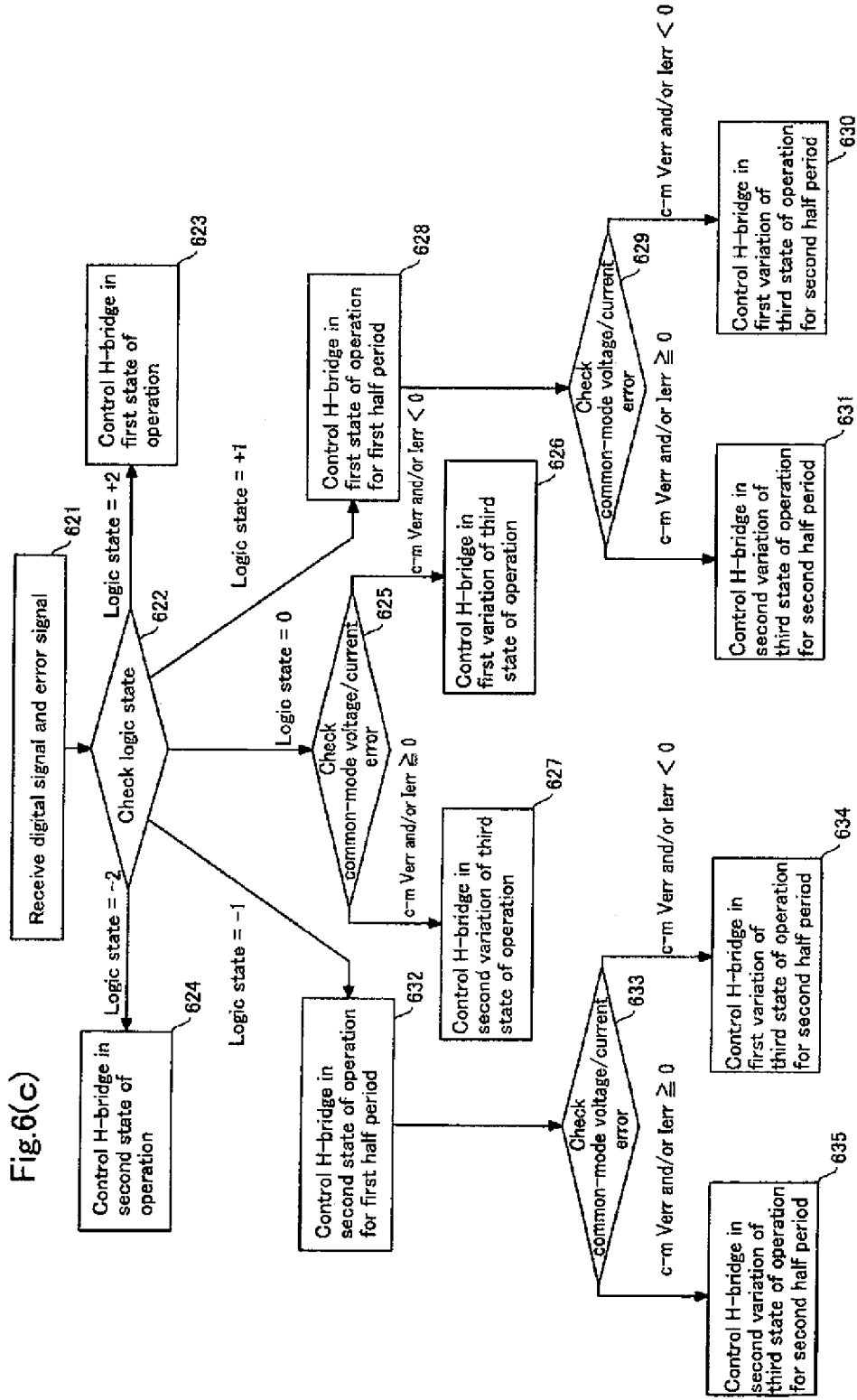

APPARATUS AND METHOD FOR CONTROLLING A COMMON-MODE VOLTAGE OF SWITCHING AMPLIFIERS

CROSS-REFERENCE TO RELATED APPLICATIONS

This application is a divisional of and claims priority to U.S. patent application Ser. No. 11/599,840, filed Nov. 15, 2006, the disclosure of which is incorporated herein by reference.

TECHNICAL FIELD

The present invention relates to an H-bridge controller, system and method for controlling a common-mode voltage and/or current of an H-bridge circuit.

BACKGROUND ART

Class-D type amplifiers are essentially switching devices where a load is connected to a power supply by low impedance switches. The low impedance switches switch between active and inactive states at frequencies much higher than a bandwidth of an input signal, and the load filters the output signal of the amplifier such that only the low frequency components of the output signal can be subsequently used. This filtering of the high frequency components of the output signal is either done explicitly in the form of LC (inductor-capacitor) circuits or implicitly as in the case of an audio speaker where the speaker is inherently a device which functions as a low-pass filter. Class-D type amplifiers are popular because they are capable of delivering a large amount of power to a load without dissipating power in the amplifier itself, thus resulting in a very high efficiency of transferring power from a power supply to a load.

FIG. 1(a) illustrates a prior art H-bridge circuit 100, the most common switch arrangement for class-D type amplifiers. The H-bridge circuit 100 includes a plurality of switches (101, 102, 103, 104) which couple a load 105 between a power supply PWR and ground GND. During a first state of operation, the switches (101, 102, 103, 104) are controlled such that a first terminal 120 of the load 105 is connected to the power supply PWR while a second terminal 121 of the load 105 is connected to ground GND. During a second state of operation, the switches (101, 102, 103, 104) are controlled such that the first terminal 120 of the load 105 is connected to ground GND while the second terminal 121 of the load 105 is connected to the power supply PWR. By switching between the first and second states of operation the connection of each side of the load to either the power supply or the ground can be periodically switched, resulting in a signal in the shape of a square wave being applied across the load. This is referred to as binary modulation since the voltage across the load has only two states.

In high performance applications, an LC filter is used to block the high frequency energy of the signal which is output from the H-bridge circuit 100, thus allowing only the low frequency energy to be applied to the load 105. The high quality inductors and capacitors required for this filter are relatively large and expensive, so cost-sensitive applications sometimes opt for filterless operation. In filterless operations, there is no LC filter used to block the high frequency energy of the signal which is output from the H-bridge circuit 100. Consequently, all of the high frequency energy of the signal which is output from the H-bridge circuit 100 is applied to the load 105, resulting in more power dissipation in the load 105 than the case where an LC filter is used.

The switches (101, 102, 103, 104) may also be controlled in a first variation of a third state of operation such that both of the first terminal 120 of the load 105 and the second terminal 121 of the load 105 are connected to the power supply PWR. Alternatively, the switches (101, 102, 103, 104) may be controlled in a second variation of the third state of operation such that both of the second terminal 120 of the load 105 and the second terminal 121 of the load 105 are connected to ground GND. By operating the H-bridge circuit 100 in three states of operation, the excess power dissipation in the load 105 for filterless operation is significantly reduced. Operating an H-bridge circuit 100 in three states of operation is referred to as ternary modulation.

Provision for a third state of operation, while having the desired effect on reducing the excess power dissipation in the load 105 for filterless operation, introduces a new problem. For an H-bridge circuit 100 which is operated in two states, the voltage applied to the load 105 is always purely differential. Consequently, the common-mode voltage of the load 105, defined as the average of the voltage at each of the first terminal 120 of the load 105 and the second terminal 121 of the load 105, or equivalently the current through the load 105, never changes. The common-mode voltage is always approximately equal to the voltage of the power supply divided by two. When provision is made for the H-bridge circuit 100 to operate in a third state, for example the aforementioned second variation where both of the second terminal 120 of the load 105 and the second terminal 121 of the load 105 are connected to ground GND, the common-mode voltage of the load 105 is equal to the ground voltage. Similarly, no current will flow through the load 105. Thus, when an H-bridge circuit 100 is operated in three states of operation, the common-mode voltage and current of the load 105 will vary based on the state of operation.

If every element of the H-bridge circuit 100 and load 105, including wiring parasitics, is perfectly balanced, the variation of the common-mode voltage and current of the load 105 is not a problem, at least from a signal integrity standpoint. However, the inevitable mismatches between the two sides of the H-bridge circuit 100 and the load 105 will cause voltages applied to the two terminals of the load 105 to not be identical. Some of this variation in common-mode voltage will show up as a differential voltage and a current through the load 105, consequently corrupting the output signal.

In order to solve the problem of variations in the common-mode voltage and current of the load 105, it is desired to modulate the third state of operation between each of the variations of the third state of operation. By switching between the two variations for the third state of operation, variations in the average common-mode voltage and current will be reduced.

FIG. 1(b) illustrates a prior art device that attempts to address this problem as described by M. Corsi et. Al. in U.S. Pat. No. 6,262,632 B1. The circuit implementation described by M. Corsi includes two pulse width modulators (150, 160) which each include a single-ended differential amplifier and a comparator for generating a pulse-width modulated signal from an audio input signal that is subsequently applied to half of an H-bridge circuit 100. One of the pulse width modulators 150 and its corresponding half H-bridge circuit construct a positive half circuit, while the other one of the pulse width modulators 160 and its corresponding half H-bridge circuit construct a negative half circuit. The positive and negative half circuits operate in inverse phase with respect to one another and provide signals (outp, outn) which are subsequently applied to a load 105.

The method for controlling the H-bridge circuit 100 illustrated in FIG. 1(b) has many deficiencies. For example, this method only works for pulse width modulators. Further, this method requires multiple single-ended differential amplifiers, consequently resulting in a large spatial implementation and the many disadvantages resulting from such a large spatial implementation.

The present invention is provided to resolve the above-described problems. The objectives of the present invention are to provide an apparatus and method that reduce variations in an average common-mode voltage and current applied to a load via an H-bridge circuit while reducing the spatial requirements of the implementation of such an apparatus and method.

DISCLOSURE OF THE INVENTION

An H-bridge controller for controlling a common-mode voltage and/or current of an H-bridge circuit of the present invention is provided. The H-bridge controller comprises a section for receiving a signal indicating at least one of a common-mode voltage and common-mode current of the H-bridge circuit, and a section for generating control signals which determine switching of the H-bridge circuit so as to control at least one of the common-mode voltage and common-mode current of the H-bridge circuit.

The signal may be a digital signal having one of a plurality of voltage levels, the one voltage level selected based on a modulated input signal, each of the plurality of voltage levels being assigned to a corresponding one of a plurality of logic states. The H-bridge circuit may include a plurality of states of operation, each of the plurality of states of operation being associated with a corresponding one of the plurality of logic states. One of the plurality of states of operation may include two variations. The section for generating control signals may generate control signals which control the H-bridge circuit to operate in one of the two variations. The one of the two variations may be determined based on the received signal so as to reduce variations in at least one of an average of the common-mode voltage of the H-bridge circuit and an average of the common-mode current of the H-bridge circuit.

The received signal may include a plurality of square pulses each having a predetermined period, and the H-bridge controller may further comprise a section for generating an activation signal which activates a return-to-zero logic circuit to modify the control signals to switch the H-bridge circuit into a state of operation associated with the logic state zero for a portion of the predetermined period.

The H-bridge circuit may be coupled between a ground voltage and a power supply having a voltage equal to $V_{DD}$. The H-bridge circuit may be controlled to operate in one of the plurality of states of operation. The plurality of states of operation may include a first state of operation wherein a voltage applied to a first terminal of the load is equal to $V_{DD}$ and a voltage applied to a second terminal of the load is equal to ground, a second state of operation wherein a voltage applied to the first terminal of the load is equal to ground and a voltage applied to the second terminal of the load is equal to $V_{DD}$, a first variation of a third state of operation wherein a voltage applied to each of the first and second terminals of the load is equal to $V_{DD}$, and a second variation of the third state of operation wherein a voltage applied to each of the first and second terminals of the load is equal to ground.

Each of the first state of operation, the second state of operation, the first variation of the third state of operation and the second variation of the third state of operation may be associated with a logic state. The control signals may control the H-bridge circuit to operate in the state of operation associated with the logic state assigned to the voltage level of the received digital signal.

The H-bridge controller may further comprise a section for checking the voltage and/or current level of the received digital signal, a section for assigning a logic state to the voltage and/or current level of the received digital signal, a section for controlling the H-bridge circuit in the state of operation associated with the logic state if the logic state is associated with a state of operation having no variations, and a section for controlling the H-bridge circuit in one of a plurality of variations of a state of operation associated with the logic state that reduces variations in at least one of the average common-mode voltage and the average common-mode current of the H-bridge circuit if the logic state is associated with a state of operation having a plurality of variations.

The logic states may include −1, 0 and +1, and the H-bridge controller may further comprise a section for: checking the logic state, if the logic state is equal to +1, controlling the H-bridge circuit to operate in the first state of operation, if the logic state is equal to −1, controlling the H-bridge circuit to operate in the second state of operation, if the logic state is equal to 0, checking an error of the common-mode voltage and/or current indicated by the signal, if the common-mode voltage and/or current error is less than zero, controlling the H-bridge circuit to operate in the first variation of the third state of operation, and if the error of the common-mode voltage and/or current is greater than or equal to zero, controlling the H-bridge circuit to operate in the second variation of the third state of operation.

The received digital signal may include a plurality of square pulses each having a predetermined period, the logic states include −2, −1, 0, +1 and +2, and the H-bridge controller may further comprise a section for: checking the logic state, if the logic state is equal to +2, controlling the H-bridge circuit to operate in the first state of operation, if the logic state is equal to −2, controlling the H-bridge circuit to operate in the second state of operation, if the logic state is equal to 0, checking the error of the common-mode voltage and/or current indicated by the signal, if the error of the common-mode voltage and/or current is less than zero, controlling the H-bridge circuit to operate in the first variation of the third state of operation, and if the error of the common-mode voltage and/or current is greater than or equal to zero, controlling the H-bridge circuit to operate in the second variation of the third state of operation, if the logic state is equal to +1: controlling the H-bridge circuit to operate in the first state of operation for a first half of the predetermined period, checking the error of the common-mode voltage and/or current indicated by the signal, if the error of the common-mode voltage and/or current is less than zero, controlling the H-bridge circuit to operate in the first variation of the third state of operation for a second half of the predetermined period, and if the error of the common-mode voltage and/or current is greater than or equal to zero, controlling the H-bridge circuit to operate in the second variation of the third state of operation for the second half of the predetermined period, if the logic state is equal to −1: controlling the H-bridge circuit to operate in the second state of operation for a first half of the predetermined period, checking the error of the common-mode voltage and/or current indicated by the signal, if the error of the common-mode voltage and/or current is less than zero, controlling the H-bridge circuit to operate in the first variation of the third state of operation for a second half of the predetermined period, and if the error of the common-mode voltage and/or current is greater than or equal to zero, controlling the H-bridge circuit to operate in the second variation of the third state of operation for the second half of the predetermined period.

The digital signal may include voltage levels assigned to three logic states or five logic states, and the modulated input signal may be modulated using either pulse width modulation or sigma delta modulation.

A system for controlling a common-mode voltage and/or current of an H-bridge circuit of the present invention is provided. The system comprises a modulator for receiving an input signal, modulating the received input signal, and generating a digital signal having one of a plurality of voltage levels, the one voltage level selected based on the modulated received input signal, each of the plurality of voltage levels being assigned to a corresponding one of a plurality of logic state, an H-bridge controller for receiving the digital signal and generating control signals for controlling operation of the H-bridge circuit, an H-bridge circuit for receiving the control signals and operating based on the received control signals so as to output an analog signal to a load, and a common-mode error determination circuit for generating an error signal indicating at least one of an error of a common-mode voltage and an error of a common-mode current of the H-bridge circuit, wherein the H-bridge controller receives the error signal and generates the control signals based on the received digital signal and the received error signal so as to reduce variations in at least one of an average of the common-mode voltage and an average of the common-mode current of the H-bridge circuit.

The H-bridge circuit may include a plurality of states of operation, each of the plurality of states of operation is associated with a corresponding one of the plurality of logic states. One of the plurality of states of operation may include two variations. The H-bridge controller may generate control signals which control the H-bridge circuit to operate in one of the two variations. The one of the two variations may be determined based on the received error signal so as to reduce variations in at least one of an average of the common-mode voltage of the H-bridge circuit and an average of the common-mode current of the H-bridge circuit.

The received signal may include a plurality of square pulses each having a predetermined period, and the system may further comprise a return-to-zero logic circuit for receiving the control signals from the H-bridge controller and outputting modified control signals which cause the H-bridge circuit to operate in a state of operation associated with the logic zero for a portion of the predetermined time.

The modulator may include at least one integrator circuit, each integrator circuit for integrating the received input signal and providing at least one integrated input signal, a summation circuit coupled to the at least one integrator circuit for receiving the at least one integrated input signal from each integrator circuit and summing the at least one received integrated input signal to provide a summed output, and a quantizer coupled to the summation circuit for receiving and quantizing the summed output so as to generate the digital signal.

The load may include a pair of input terminals. The H-bridge circuit may include two pairs of switches, the switches of each pair of switches being connected in series with one another between a voltage source and a ground. An analog voltage between the switches of each pair of switches may be applied to a corresponding one of the pair of input terminals.

The common-mode error determination circuit may include a common-mode voltage sensing and calculation circuit for sensing the analog signal output to the load and calculating a common-mode voltage and/or current error, and an integrator circuit for integrating the calculated common-mode voltage and/or current error and providing an integrated calculated common-mode voltage and/or current error as the error signal.

The common-mode error determination circuit may include a logic state detection and error estimation circuit for detecting the logic state and estimating a common-mode voltage and/or current error, and an integrator circuit for integrating the estimated common-mode voltage and/or current error and providing an integrated estimated common-mode voltage and/or current error as the error signal.

The common-mode error determination circuit may include a logic state detection and error estimation circuit for detecting the logic state and estimating a common-mode voltage and/or current error, and a digital filter for filtering the estimated common-mode voltage and/or current error and providing a filtered estimated common-mode voltage and/or current error as the error signal.

The common-mode error determination circuit may estimate a common-mode voltage and/or current based on the digital signal or information within the modulator, calculate an estimated common-mode and/or current error based on the estimated common-mode voltage and/or current, and provide the estimated common-mode and/or current error as the error signal.

A method for controlling a common-mode voltage and/or current of an H-bridge circuit of the present invention is provided. The method comprises receiving a signal indicating at least one of a common-mode voltage and common-mode current of the H-bridge circuit, and generating control signals which determine switching of the H-bridge circuit so as to control at least one of the common-mode voltage and common-mode current of the H-bridge circuit.

The signal may be a digital signal having one of a plurality of voltage levels, the one voltage level selected based on a modulated input signal, each of the plurality of voltage levels being assigned to a corresponding one of a plurality of logic states. The H-bridge circuit may include a plurality of states of operation, each of the plurality of states of operation being associated with a corresponding one of the plurality of logic states. One of the plurality of states of operation may include two variations. The step of generating control signals may generate control signals which control the H-bridge circuit to operate in one of the two variations. The one of the two variations may be determined based on the received signal so as to reduce variations in at least one of an average of the common-mode voltage of the H-bridge circuit and an average of the common-mode current of the H-bridge circuit.

The received digital signal may include a plurality of square pulses each having a predetermined period. The method may further comprise generating an activation signal which activates a return-to-zero logic circuit to modify the control signals to switch the H-bridge circuit into a state of operation associated with the logic state zero for a portion of the predetermined period.

The method may further comprise checking the voltage and/or current level of the received digital signal, assigning a logic state to the voltage and/or current level of the received digital signal, controlling the H-bridge circuit in the state of operation associated with the logic state if the logic state is associated with a state of operation having no variations, and controlling the H-bridge circuit in one of a plurality of variations of a state of operation associated with the logic state that reduces variations in at least one of the average common-mode voltage and the average common-mode current of the H-bridge circuit if the logic state is associated with a state of operation having a plurality of variations.

The logic states may include −1, 0 and +1. The method may further comprise checking the logic state, if the logic state is equal to +1, controlling the H-bridge circuit to operate in the first state of operation, if the logic state is equal to −1, controlling the H-bridge circuit to operate in the second state of operation, if the logic state is equal to 0, checking an error of the common-mode voltage and/or current indicated by the signal, if the common-mode voltage and/or current error is less than zero, controlling the H-bridge circuit to operate in the first variation of the third state of operation, and if the error of the common-mode voltage and/or current is greater than or equal to zero, controlling the H-bridge circuit to operate in the second variation of the third state of operation.

The received digital signal may include a plurality of square pulses each having a predetermined period, the logic states include −2, −1, 0, +1 and +2. The method may further comprise checking the logic state, if the logic state is equal to +2, controlling the H-bridge circuit to operate in the first state of operation, if the logic state is equal to −2, controlling the H-bridge circuit to operate in the second state of operation, if the logic state is equal to 0, checking the error of the common-mode voltage and/or current indicated by the signal, if the error of the common-mode voltage and/or current is less than zero, controlling the H-bridge circuit to operate in the first variation of the third state of operation, and if the error of the common-mode voltage and/or current is greater than or equal to zero, controlling the H-bridge circuit to operate in the second variation of the third state of operation, if the logic state is equal to +1: controlling the H-bridge circuit to operate in the first state of operation for a first half of the predetermined period, checking the error of the common-mode voltage and/or current indicated by the signal, if the error of the common-mode voltage and/or current is less than zero, controlling the H-bridge circuit to operate in the first variation of the third state of operation for a second half of the predetermined period, and if the error of the common-mode voltage and/or current is greater than or equal to zero, controlling the H-bridge circuit to operate in the second variation of the third state of operation for the second half of the predetermined period, if the logic state is equal to −1: controlling the H-bridge circuit to operate in the second state of operation for a first half of the predetermined period, checking the error of the common-mode voltage and/or current indicated by the signal, if the error of the common-mode voltage and/or current is less than zero, controlling the H-bridge circuit to operate in the first variation of the third state of operation for a second half of the predetermined period, and if the error of the common-mode voltage and/or current is greater than or equal to zero, controlling the H-bridge circuit to operate in the second variation of the third state of operation for the second half of the predetermined period.

A method for controlling a common-mode voltage and/or current of an H-bridge circuit of the present invention is provided. The method comprises a modulator receiving an input signal, modulating the received input signal, and generating a digital signal having one of a plurality of voltage levels, the one voltage level selected based on the modulated received input signal, each of the plurality of voltage levels being assigned to a corresponding one of a plurality of logic states, an H-bridge controller receiving the digital signal and generating control signals for controlling operation of the H-bridge circuit, an H-bridge circuit receiving the control signals and operating based on the received control signals so as to output an analog signal to a load, and a common-mode error determination circuit generating an error signal indicating at least one of an error of a common-mode voltage and an error of a common-mode current of the H-bridge circuit, wherein the H-bridge controller receives the error signal and generates the control signals based on the received digital signal and the received error signal so as to reduce variations in at least one of an average of the common-mode voltage and an average of the common-mode current of the H-bridge circuit.

The H-bridge circuit may include a plurality of states of operation, each of the plurality of states of operation being associated with a corresponding one of the plurality of logic states. One of the plurality of states of operation may include two variations. The step of generating control signals may generate control signals which control the H-bridge circuit to operate in one of the two variations. The one of the two variations may be determined based on the received error signal so as to reduce variations in at least one of an average of the common-mode voltage of the H-bridge circuit and an average of the common-mode current of the H-bridge circuit.

The received signal may include a plurality of square pulses each having a predetermined period. The method may further comprise a return-to-zero logic circuit receiving the control signals and outputting modified control signals which cause the H-bridge circuit to operate in a state of operation associated with the logic zero for a portion of the predetermined time.

The step of modulating the received input signal may includes at least one integrator circuit integrating the received input signal and providing at least one integrated input signal, a summation circuit receiving the at least one integrated input signal from each integrator circuit and summing the at least one received integrated input signal to provide a summed output, and a quantizer receiving and quantizing the summed output so as to generate the digital signal.

The load may include a pair of input terminals. The H-bridge circuit may include two pairs of switches, the switches of each pair of switches being connected in series with one another between a voltage source and a ground. The method may further comprise applying an analog voltage between the switches of each pair of switches to a corresponding one of the pair of input terminals.

The common-mode error determination circuit may include a common-mode voltage sensing and calculation circuit and an integrator circuit. The method may further comprise the common-mode voltage sensing and calculation circuit sensing the analog signal output to the load and calculating a common-mode voltage and/or current error, and the integrator circuit integrating the calculated common-mode voltage and/or current error and providing an integrated calculated common-mode voltage and/or current error as the error signal.

The common-mode error determination circuit may include a logic state detection and error estimation circuit and an integrator circuit. The method may further comprise the logic state detection and error estimation circuit detecting the logic state and estimating a common-mode voltage and/or current error, and the integrator circuit integrating the estimated common-mode voltage and/or current error and providing an integrated estimated common-mode voltage and/or current error as the error signal.

The common-mode error determination circuit may include a logic state detection and error estimation circuit and a digital filter. The method may further comprise the logic state detection and error estimation circuit detecting the logic state and estimating a common-mode voltage and/or current error, and the digital filter filtering the estimated common-mode voltage and/or current error and providing a filtered estimated common-mode voltage and/or current error as the error signal.

The method may further comprise the common-mode error determination circuit estimating a common-mode voltage and/or current based on the digital signal or information within the modulator, calculating an estimated common-mode and/or current error based on the estimated common-mode voltage and/or current, and providing the estimated common-mode and/or current error as the error signal.

BRIEF DESCRIPTION OF THE DRAWINGS

FIG. 3(a) illustrates a generalized apparatus for controlling an H-bridge circuit including a common-mode error determination circuit using a feedback configuration.

FIG. 6(c) illustrates a flow chart of the logic operation of an H-bridge controller in the case of a digital signal having voltage levels assigned to five logic states.

BEST MODE FOR CARRYING OUT THE INVENTION

Hereinafter, the present invention will be described by way of illustrative examples with reference to the accompanying drawings.

Figure 1A:
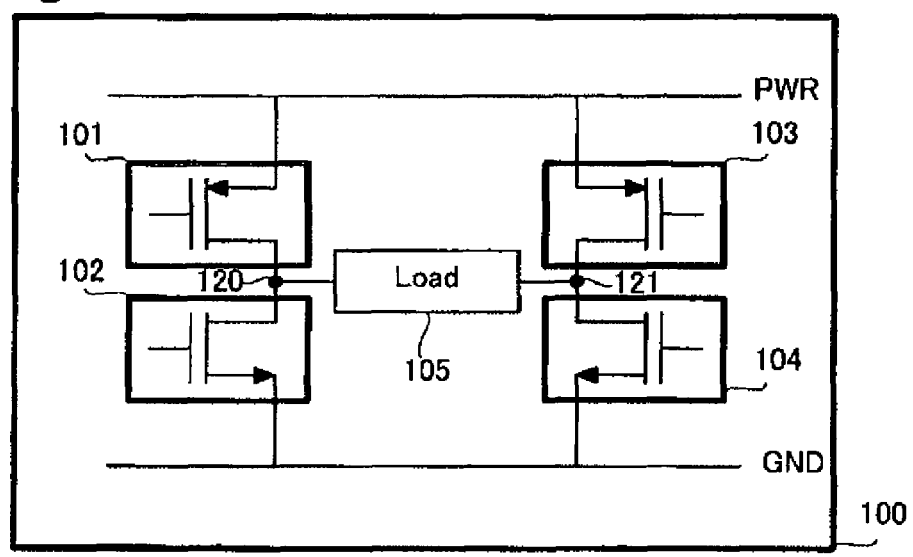
FIG. 1(a) illustrates a prior art H-bridge circuit.
Figure 1B:
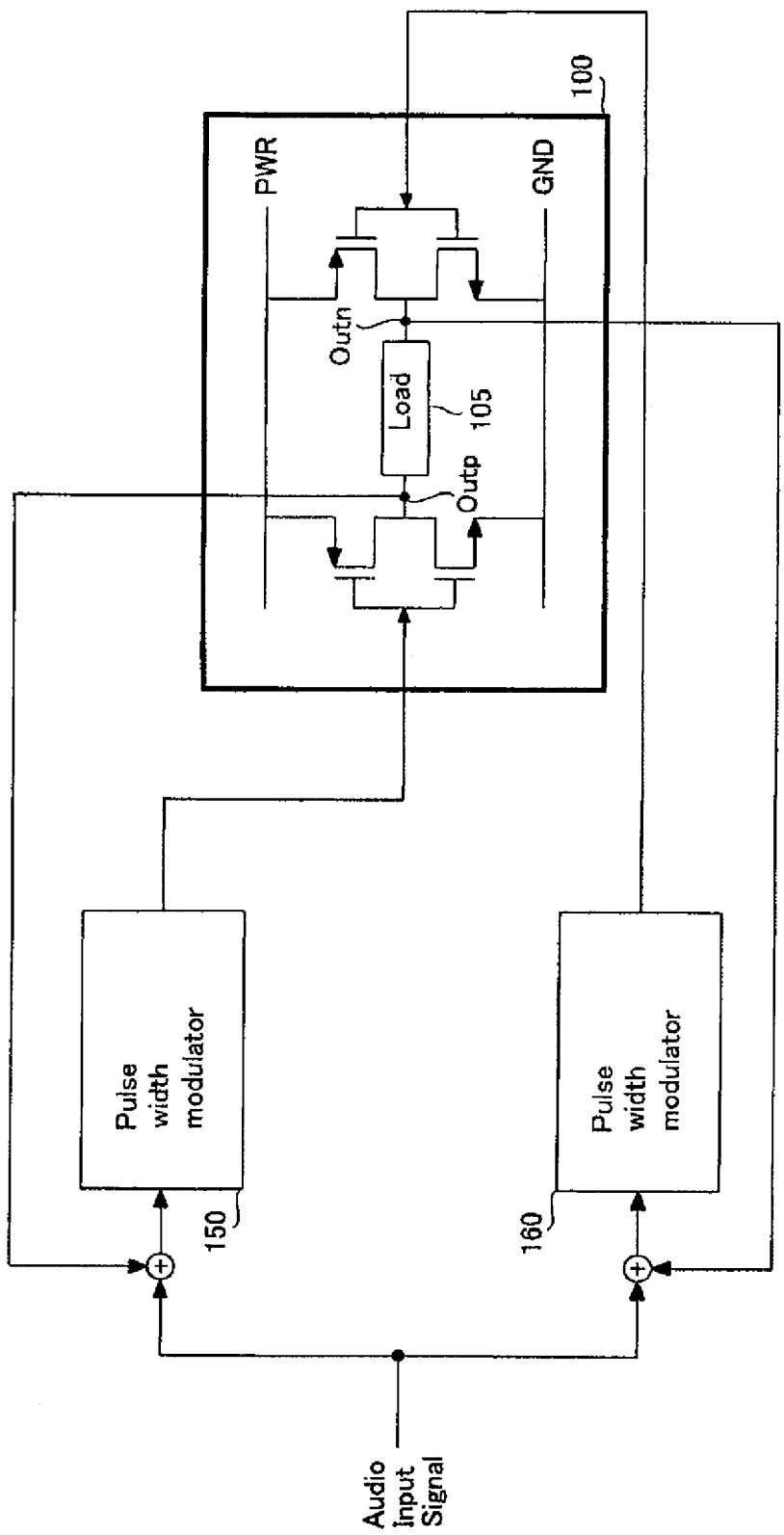
FIG. 1(b) illustrates a prior art device for applying a modulated voltage to an H-bridge circuit.
Figure 2A:
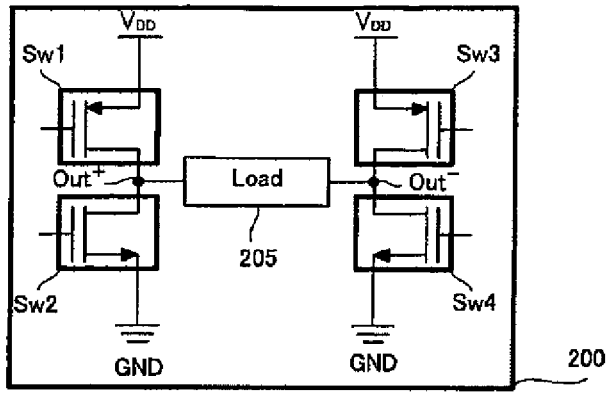
FIG. 2(a) illustrates an H-bridge circuit in a static configuration.

FIGS. 2(a)-2(e) illustrate an H-bridge circuit 200 according to the present invention. FIG. 2(a) illustrates the H-bridge circuit 200 in a static configuration. The H-bridge circuit 200 includes two pairs of switches (Sw1, Sw2, Sw3, Sw4), the switches of each pair of switches (Sw1, Sw2, Sw3, Sw4) being connected in series with one another between a voltage source $V_{DD}$ and a ground GND. A load 205 has a pair of input terminals each connected between the switches of each pair of switches (Sw1, Sw2, Sw3, Sw4) at one of a pair of output nodes (out$^+$, out$^-$). While the switches (Sw1, Sw2, Sw3, Sw4) illustrated in FIGS. 2(a) to 2(e) and in the other figures of the present application are depicted as MOS transistors, the specification is not intended to be limited thereto. Rather, bipolar transistors (BJTs) or any other semiconductor device capable of performing the function of switching between conductive and non-conductive states may be used in place of the illustrated MOS transistors without departing from the scope of the present invention.

Figure 2B:
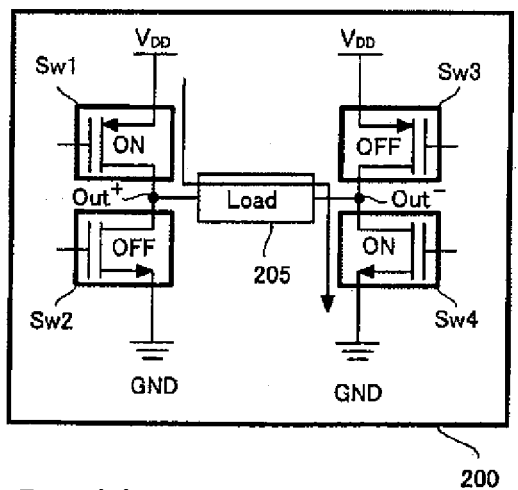
FIG. 2(b) illustrates an H-bridge circuit in a first state of operation.

FIG. 2(b) illustrates the H-bridge circuit 200 in a first state of operation where the switches Sw1, Sw2, Sw3 and Sw4 are controlled to be in ON, OFF, OFF and ON states, respectively. A common-mode voltage of the load 105 is equal to the average of a voltage at a first one out$^+$ of the pair of output nodes (out$^+$, out$^-$) and a voltage at a second one out$^-$ of the pair of output nodes (out$^+$, out$^-$). During the first state of operation, the common-mode voltage of the load 205 will be equal to $V_{DD}/2$.

Figure 2C:
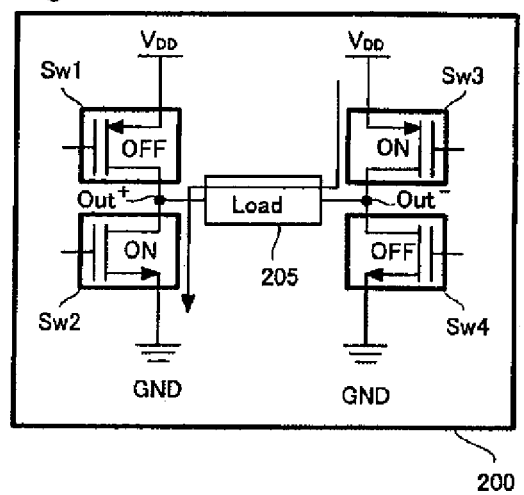
FIG. 2(c) illustrates an H-bridge circuit in a second state of operation.

FIG. 2(c) illustrates the H-bridge circuit 200 in a second state of operation where the switches Sw1, Sw2, Sw3 and Sw4 are controlled to be in OFF, ON, ON and OFF states, respectively. During the second state of operation, the common-mode voltage of the load will be equal to $V_{DD}/2$.

Figure 2D:
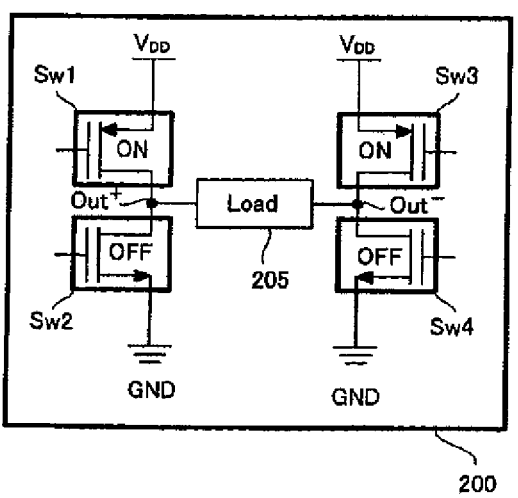
FIG. 2(d) illustrates an H-bridge circuit in a first variation of a third state of operation.

FIG. 2(d) illustrates the H-bridge circuit 200 in a first variation of a third state of operation where the switches Sw1, Sw2, Sw3 and Sw4 are controlled to be in ON, OFF, ON and OFF states, respectively. During the first variation of the third state of operation, the common-mode voltage of the load will be equal to $V_{DD}$.

Figure 2E:
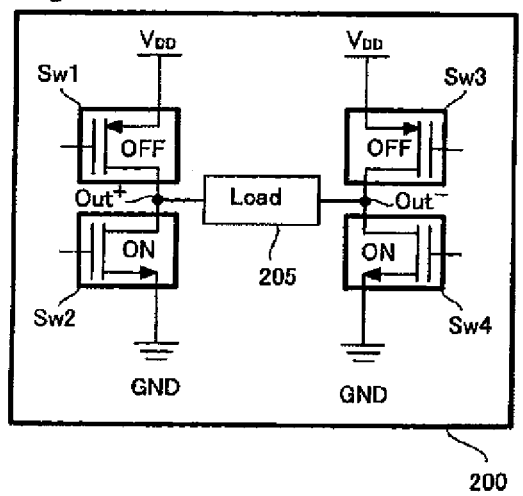
FIG. 2(e) illustrates an H-bridge circuit in a second variation of a third state of operation.

FIG. 2(e) illustrates the H-bridge circuit 200 in a second variation of the third state of operation where the switches Sw1, Sw2, Sw3 and Sw4 are controlled to be in OFF, ON, OFF and ON states, respectively. During the second variation of the third state of operation, the common-mode voltage of the load will be equal to 0.

FIG. 3(a) illustrates a generalized apparatus for controlling an H-bridge circuit using a feedback configuration according to the present invention. The generalized apparatus includes a modulator 320 having two input terminals for receiving a signal which is a summation of an input signal (in$^+$, in$^-$) and an output signal provided from an H-bridge circuit 300. Summers (331, 332) are provided for summing the input signal (in$^+$, in$^-$) and the output signal. The input signal (in$^+$, in$^-$) is analog in nature, and may be sinusoidal or a combination of multiple sinusoidal waveforms.

The modulator 320 will function to modulate the received signal. The modulator 320 may apply arbitrary modulation to the received signal, including sigma-delta modulation, pulse width modulation and the like. The modulator 320 will output a digital signal having a discrete voltage level based on the modulated input signal. The voltage level will be determined by the input signal and the type of modulation performed by the modulator 320, wherein a greater number of logic levels will result in the a reduced amount of noise introduced into the received signal. The effects of the present invention are realized when at least three discrete voltage levels are used.

An H-bridge controller 310 is coupled to the modulator 320 for receiving the digital signal output from the modulator 320. The H-bridge controller 310 assigns a logic state to the digital signal for each discrete voltage level and generates control signals for controlling an H-bridge circuit 300 based on the assigned logic state.

In particular, each voltage level of the digital signal output from the modulator 320 is assigned to a particular logic state which is pre-assigned to control signals which control the H-bridge circuit 300 to output a particular voltage and/or a particular current.

For example, in the case of the modulator outputting a digital signal having three discrete voltage levels, +V, 0, −V, the H-bridge controller will assign the logic states 1, 0 and −1, respectively. The H-bridge controller will then generate control signals for controlling the H-bridge circuit 300 to output voltages of $+V_{DD}$, 0 and $-V_{DD}$, for the logic states 1, 0 and −1, respectively. Similarly, the control signals will control the H-bridge circuit 300 to output currents of $+V_{DD}/R$, 0 and $+V_{DD}/R$ where R is the resistance of the load 205.

In the case of the modulator outputting a digital signal having five discrete logic levels, the logic states −2, 0 and 2 can be treated the same as the 1, 0 and −1 logic states in the 3-logic state case. The logic states −1 and 1 can be generated by the use of a return-to-zero pulse such that they have an output voltage of $+V_{DD}$ and $-V_{DD}$, respectively, but with only half the pulse width as compared to the 3-logic state case. This concept regarding a plurality of logic states greater than three via the use of a return-to-zero pulse is further explained below.

Although the summers (331, 332) are illustrated to sum the input signal (in+, in−) with the output signal provided from the H-bridge circuit 300, alternatively the input signal (in+, in−) may be summed with a signal provided from an output of the modulator 320 or the H-bridge controller 310.

The H-bridge circuit 300 includes a load 305 and is coupled to the H-bridge controller 310, the summers (331, 332) and a common-mode error determination circuit 340. The H-bridge circuit 300 functions to receive the control signals from the H-bridge controller 310 and generate output voltages. The output voltage levels are subsequently sent to both the summers (331, 332) and the load 305.

The common-mode error determination circuit 340 determines and provides an error signal to the H-bridge controller 310 which is used by the H-bridge controller to determine which of a plurality of switch positions associated with the same logic state is the H-bridge circuit 300 is controlled in so as to reduce variations in the average common-mode voltage of the H-bridge circuit 300. Similarly, variations in the average common-mode current of the H-bridge circuit 300 are reduced.

The error signal indicates the common-mode voltage error or a function of the common-mode voltage error which is directly related to a moving common-mode voltage resulting from operation of the H-bridge circuit 300 in a plurality of states which do not have identical common-mode voltages. The common-mode voltage is referred to as moving since the common-mode voltage is not constant, but rather changes based on the state of operation. With respect to the common-mode voltage error, it is in particular equal to the difference between the common-mode voltage of the H-bridge circuit 300 and a predetermined constant common-mode voltage. Alternatively or additionally, the error signal may indicate the common-mode voltage current or a function thereof which is directly relating to a moving common-mode current. The common-mode voltage current is equal to the difference between the common-mode current of the H-bridge circuit 300 and a predetermined constant common-mode current.

For example, consider operation of the H-bridge circuit 300 in three states of operation; i.e. assigning the three logic states −1, 0 and +1 to the digital signal output from the modulator 320, the three logic states being pre-assigned to control the H-bridge circuit 300 to output voltages of $+V_{DD}$, 0 and $-V_{DD}$. For the logic states −1 and +1, the H-bridge circuit 300 may be controlled in the first and second states of operation, respectively, as illustrated in FIGS. 2(b) and 2(c), respectively. In this case, the common-mode voltage of the H-bridge circuit 300 is equal to $V_{DD}/2$ for each of the −1 and +1 logic states. For the logic state of 0, however, in the event the H-bridge circuit 300 is controlled in the first variation of the third state of operation, as illustrated in FIG. 2(d), the common-mode voltage of the H-bridge circuit 300 is equal to $V_{DD}$. In the event the H-bridge circuit 300 is controlled in the second variation of the third state of operation, as illustrated in FIG. 2(e), the common-mode voltage of the H-bridge circuit 300 is equal to zero. When the H-bridge circuit 300 is controlled to operate in the three states of operation, the common-mode voltage may thus move between 0, $V_{DD}/2$ and $V_{DD}$.

Choosing $V_{DD}/2$ as the predetermined constant common-mode voltage is efficient since the average common-mode voltage of the H-bridge circuit 300 when equally switching between each of the first and second variations of the third state of operation is equal to the common-mode voltage of the H-bridge circuit 300 when controlling the H-bridge circuit in the first and second states of operation. In particular, both the +1 and −1 logic states result in common-mode voltages equal to $V_{DD}/2$. When the H-bridge circuit 300 is controlled to output a voltage for the logic state 0, the common-mode voltage error will be approximately equal to $\pm V_{DD}/2$. The common-mode voltage error is approximately equal to $\pm V_{DD}/2$, based on which variation of the third state of operation the H-bridge circuit 300 is controlled in. Equally switching control of the H-bridge circuit 300 between each of the first and second variations of the third state of operation will result in the common-mode voltage error of the H-bridge circuit 300 being equal to zero on average, consequently reducing variations in the average common-mode voltage of the H-bridge circuit 300.

Choosing $V_{DD}/2$ as the predetermined constant common-mode voltage, while being efficient, is only exemplary. An arbitrary predetermined constant common-mode voltage can be chosen; i.e. the predetermined constant common-mode voltage may be equal to $V_{DD}/4$. In this case, it would be desired to switch between the first and second variations of the third state of operation such that the average common-mode voltage of the H-bridge circuit 300 is approximately equal to $V_{DD}/4$.

Figure 3B:
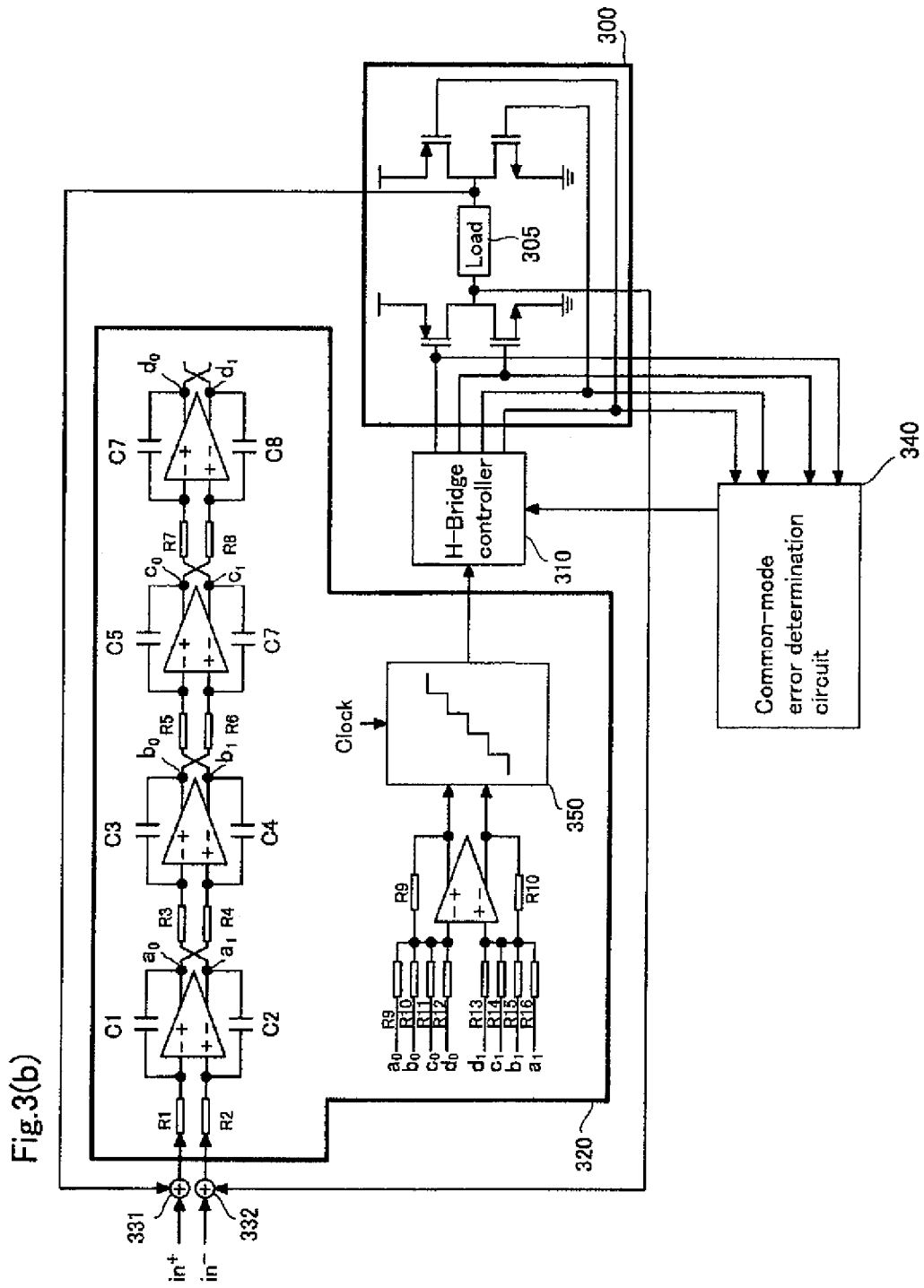
FIG. 3(b) illustrates an example of a generalized apparatus for controlling an H-bridge circuit.

FIG. 3(b) illustrates an example of the apparatus for controlling an H-bridge circuit illustrated in FIG. 3(a). In this example, the modulator 320 applies sigma delta modulation to the received signal.

The modulator 320 includes a plurality of integrator circuits for receiving the signal from the summers (331, 332), integrating the received signal and providing integrated signals to a summation circuit. The number of integrator circuits is arbitrary, wherein increasing the number of integrator circuits results in a smoother representation of the received signal. The example illustrated in FIG. 3(b) shows a fourth order sigma delta modulator.

Each integrator circuit includes an amplifier having inputs each connected to one of a plurality of resistive elements (R1-R8), and outputs (a0, a1, b0, b1, c0, c1, d0, d1) each connected to a respective input via one of a plurality of capacitive elements (C1-C8).

The summation circuit includes an amplifier having inputs connected to the outputs (a0, a1, b0, b1, c0, c1, d0, d1) of each of the plurality of integrator circuits via one of a plurality of resistive elements (R9-R16), and outputs connected to a respective input via one of a plurality of resistive elements (R9, R10). The summation circuit functions to sum the signals from each of the plurality of integrator circuits and provide a summed integrated signal to an N-level quantizer, where N is an arbitrary integer greater than zero.

The N-level quantizer functions to quantize the summed integrated signal into a digital signal having a discrete voltage level at a rate given by a frequency of a clock signal received by the N-level quantizer.

The H-bridge controller 310 receives the digital signal from the N-level quantizer, assigns a logic state to the digital signal for each discrete voltage level and generates a control signal for controlling each switch of the plurality of switches (Sw1, Sw2, Sw3, Sw4) of the H-bridge circuit 300. The H-bridge controller 310 includes an input coupled to the N-level quantizer included in the modulator 320 and further includes outputs coupled to each of the plurality of switches (Sw1, Sw2, Sw3, Sw4) included in the H-bridge circuit 300.

In the exemplary case of N=3, the H-bridge controller will assign three logic states 1, 0 and −1, respectively to the discrete voltage levels, +V, 0, −V, of the digital signal output from the N-level quantizer. For the logic states 1 and −1 the H-bridge controller 310 will control the plurality of switches (Sw1, Sw2, Sw3, Sw4) to operate in the first and second states of operation, respectively, as illustrated in FIGS. 2(b) and 2(c), respectively, such that an output voltage of $+V_{DD}$ and $-V_{DD}$, respectively, is applied to the load 305. For the logic state of 0 the H-bridge controller 310 will control the plurality of switches (Sw1, Sw2, Sw3, Sw4) to operate in either the first variation or the second variation of the third state of operation, as illustrated in either FIGS. 2(d) and 2(e). The H-bridge controller 310 may control the plurality of switches (Sw1, Sw2, Sw3, Sw4) so that there is an equal possibility the switches are controlled in each of the first and second variations of the third state of operation, so that the switches are more likely to be controlled in either one of the first and second variations of the third state of operation, or the switches are controlled in only one of the first and second variations of the third state of operation.

The element which helps determine which of the first and second variations of the third state of operation the switches of the H-bridge circuit 300 should be controlled in is the common-mode error determination circuit 340. The common-mode error determination circuit 340 is provided coupled to the gates of each of the plurality of switches included in the H-bridge circuit 300 for receiving the control signals applied to the H-bridge circuit 300 and is coupled to the H-bridge controller 310 for sending an error signal to the H-bridge controller 310. The error signal is subsequently received and used by the H-bridge controller 310 in order to reduce variations in the average common-mode voltage and current of the H-bridge circuit 300. The coupling to the gates of each of the plurality of switches (Sw1, Sw2, Sw3, Sw4) is only exemplary, as there are numerous options for receiving an error signal from the H-bridge circuit 300 and providing the error signal to the H-bridge controller 310 as discussed below.

Figure 4A:
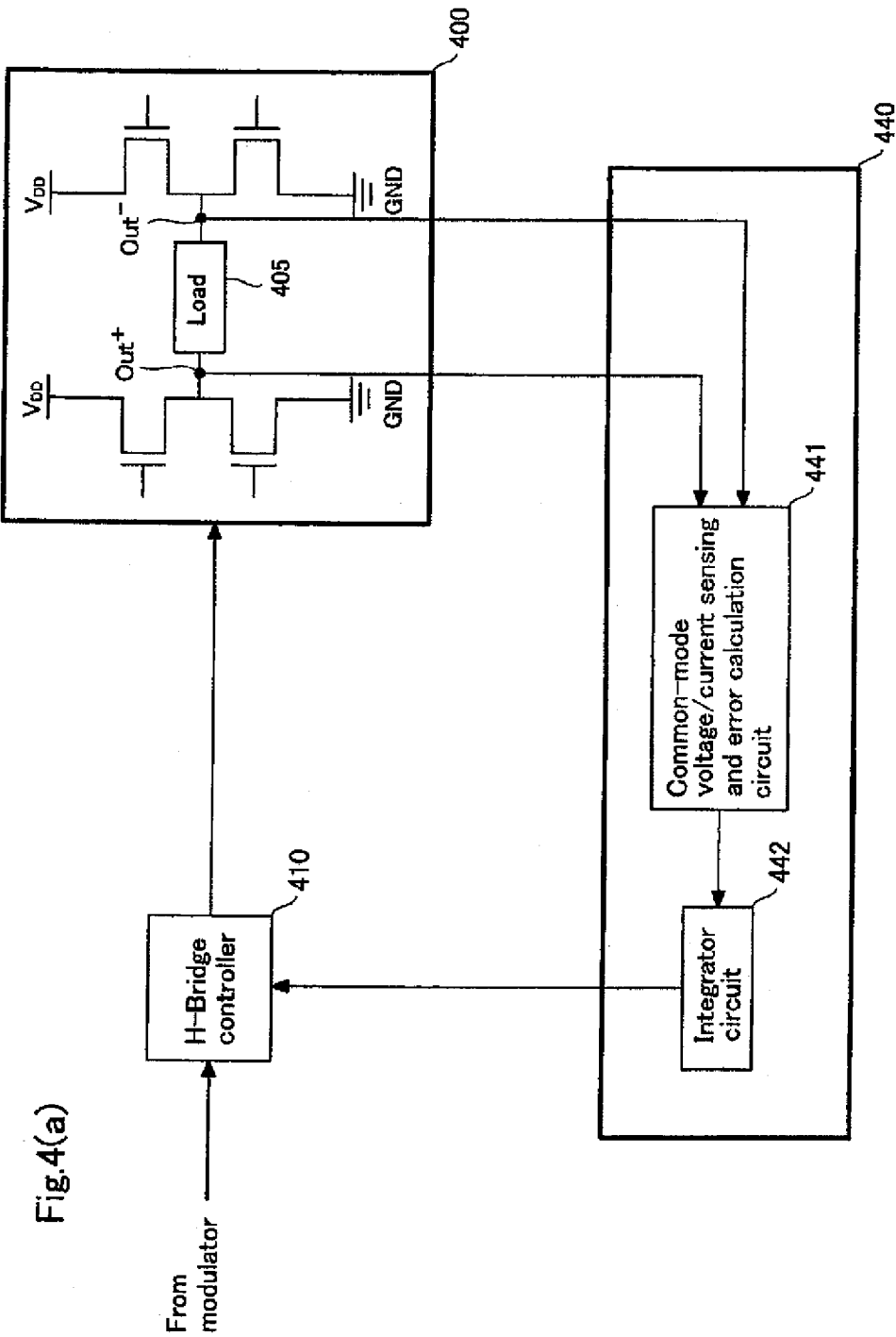
FIG. 4(a) illustrates a first common-mode error determination circuit.
Figure 4B:
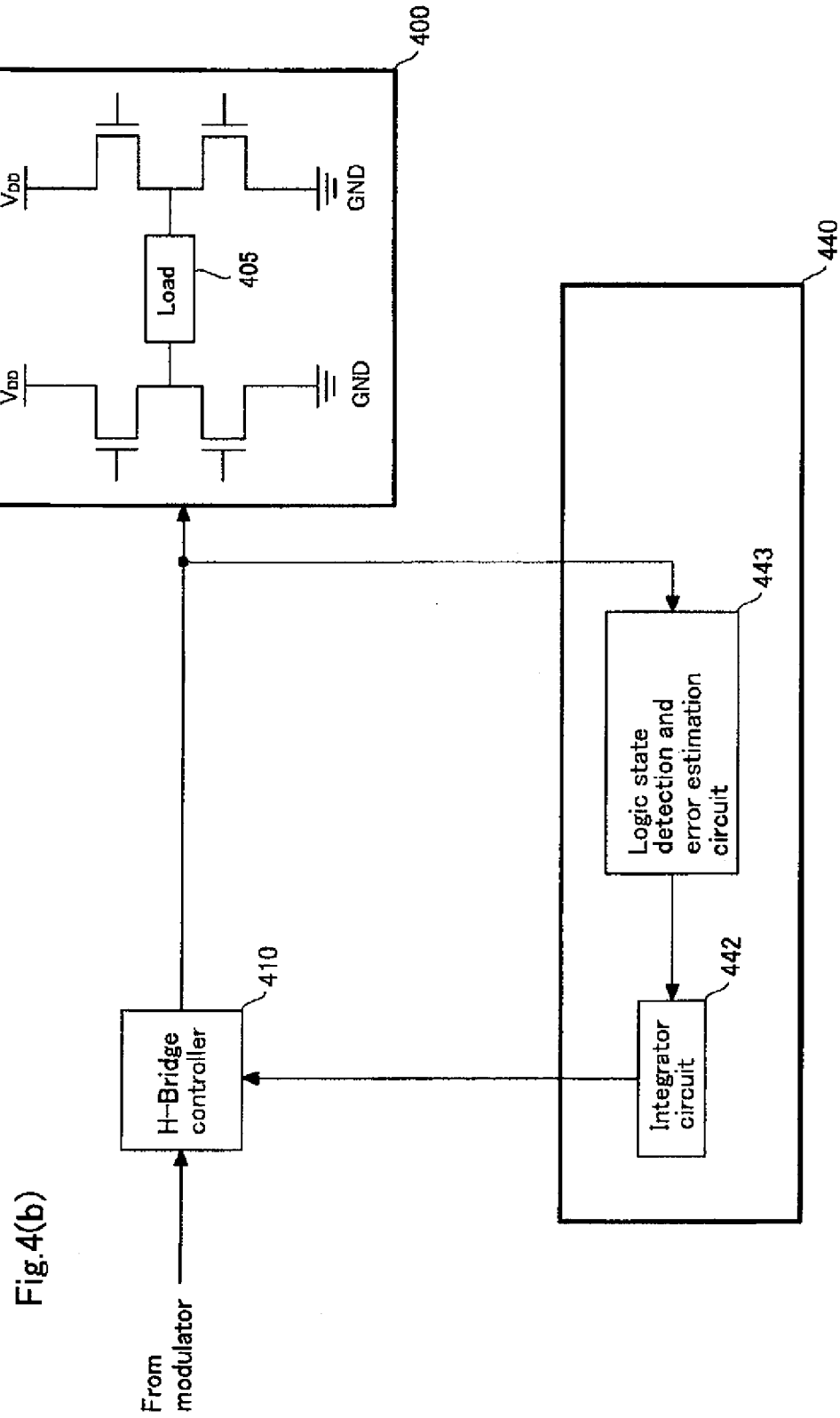
FIG. 4(b) illustrates a second common-mode error determination circuit.
Figure 4C:
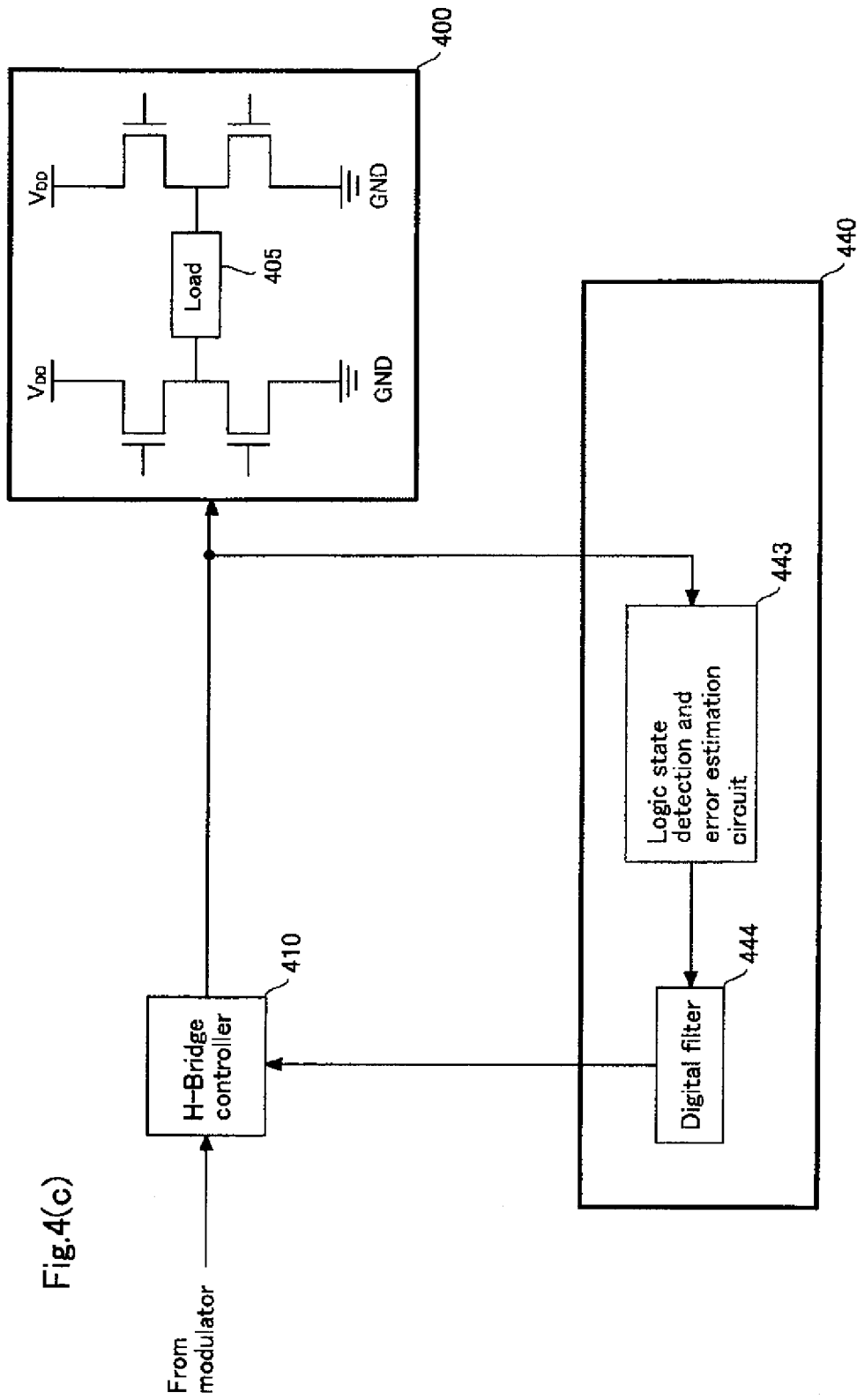
FIG. 4(c) illustrates a third common-mode error determination circuit.

FIGS. 4(a)-(c) illustrate numerous options for receiving an signal from the H-bridge circuit 400 and providing an error signal to the H-bridge controller 410. These options may be implemented for the common-mode error determination circuit 340 illustrated in either of FIGS. 3(a) and 3(b).

FIG. 4(a) illustrates a common-mode error determination circuit 440 including a common-mode voltage/current sensing and error calculation circuit 441 and an integrator circuit 442. The common-mode voltage/current sensing and error calculation circuit 441 senses an analog voltage at each of the pair of output nodes (out⁺, out⁻) of the H-bridge circuit 400 and then calculates the common-mode voltage error by calculating a difference between the sensed common-mode voltage and a predetermined constant common-mode voltage and/or calculates the common-mode current error by calculating a difference between the sensed common-mode current and a predetermined constant common-mode current. The common-mode voltage and/or current error is then output to the integrator circuit 442, where it is subsequently integrated and provided to the H-bridge controller 410 as an error signal. The H-bridge controller 410 will subsequently choose which of a plurality of switch positions associated with the same logic state the H-bridge circuit 400 is controlled in so as to reduce variations in the average common-mode voltage and/or current of the H-bridge circuit based on the integrated common-mode voltage and/or current error.

FIG. 4(b) illustrates a common-mode error determination circuit 440 including a logic state detection and error estimation circuit 443 and an integrator circuit 442. The logic state detection and error estimation circuit 443 detects a logic state corresponding to the control signals applied to each of the switches of the H-bridge circuit 400. This is similar to the example illustrated in FIG. 3(b) where the common-mode error determination circuit 340 receives a control signal applied to each of the switches of the H-bridge circuit 300. The logic state detection and error estimation circuit 443 calculates a common-mode voltage and/or current associated with the state of operation of the plurality of switches of the H-bridge circuit 400 for each logic state and subsequently estimates the common-mode voltage and/or current error by calculating the difference between the calculated common-mode voltage and a predetermined constant common-mode voltage and/or calculating the difference between the calculated common-mode current and a predetermined constant common-mode current.

The estimated common-mode voltage and/or current error is then output to the integrator circuit 442, where it is subsequently integrated and provided to the H-bridge controller 410 as an error signal. The H-bridge controller 410 will subsequently choose which of a plurality of switch positions associated with the same logic state the H-bridge circuit 400 is controlled in so as to reduce variations in the average common-mode voltage and/or current of the H-bridge circuit based on the integrated estimated common-mode voltage error and/or the integrated estimated common-mode current error.

FIG. 4(c) illustrates a common-mode error determination circuit 440 including a logic state detection and error estimation circuit 443 and a digital filter 444. The common-mode error determination circuit 440 illustrated in FIG. 4(c) operates similarly to that illustrated in FIG. 4(b), however, in this case the logic state detection and error estimation circuit 443 outputs a digital signal representing the estimated common-mode voltage error and/or the estimated common-mode current error which is subsequently received and filtered via the digital filter 444.

The digital filter 444 may be a low-pass filter having a transfer function of $y(z)=z^{-1}x(z)$, for example, where $y(z)$ represents the output signal of the digital filter 444 and $x(z)$ represents the input signal of the digital filter 444, both in the z-domain. Alternatively, the low-pass filter may have a more complex transfer function of $y(z)=(a_0 z^{-1} + a_1 z^{-2} + \ldots + a_N z^{-N})x(z)$, where N is an arbitrary positive integer and $a_0, a_1, \ldots a_N$ are coefficients with arbitrary values.

The filtered estimated common-mode voltage and/or current error is provided from the digital filter 444 to the H-bridge controller 410 as a digital error signal. The H-bridge controller 410 will subsequently choose which of a plurality of switch positions associated with the same logic state the H-bridge circuit 400 is controlled in so as to reduce variations in the average common-mode voltage and/or current of the H-bridge circuit based on the filtered estimated common-mode voltage and/or current error.

Compared to the common-mode error determination circuits illustrated in FIGS. 4(a) and 4(b), the common-mode error determination circuit 440 illustrated in FIG. 4(c) provides the advantage of an implementation which does not require analog components, which are typically more expensive and consume more space than their digital component counterparts.

Figure 5:
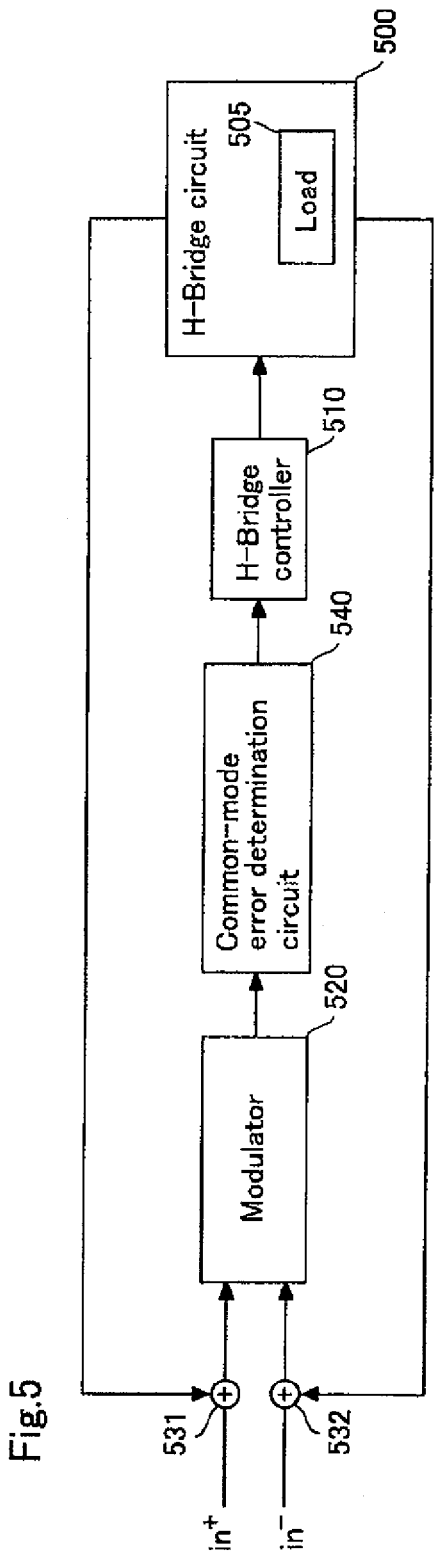
FIG. 5 illustrates a generalized apparatus for controlling an H-bridge circuit including a common-mode error determination circuit using a feed-forward configuration.

FIG. 5 illustrates a generalized apparatus for controlling an H-bridge circuit using a feed-forward configuration according to the present invention. All of the elements illustrated in FIG. 5 with the exception of the common-mode error determination circuit 550 perform similarly to those illustrated in FIG. 3(a), thus a description is not included herein for conciseness.

Compared to the embodiment illustrated in FIG. 3(a), however, the embodiment illustrated in FIG. 5 uses a feed-forward configuration rather than a feedback configuration. Instead of determining an error signal from an output of the H-bridge circuit 300 or output of the H-bridge controller 310, the H-bridge controller 510 illustrated in FIG. 5 receives an error signal from the common-mode error determination circuit 550. The error signal indicates an estimate of the common-mode voltage and/or current error of the H-bridge circuit 500. The common-mode error determination circuit 550 uses either the digital signal output from the modulator 520 or information within the modulator 520 itself to estimate the common-mode voltage and/or current of the H-bridge circuit at a particular point in time, and subsequently calculate the estimated common-mode voltage error as being equal to the difference between the estimated common-mode voltage and a predetermined constant common-mode voltage and/or calculate the estimated common-mode current error as being equal to the difference between the estimated common-mode current and a predetermined constant common-mode current.

For example, in the case that the modulator 520 outputs a digital signal having a particular voltage level, the common-mode error estimation circuit 550 determines a voltage which the H-bridge circuit 500 should apply to the load 505 in response the H-bridge controller 510 generating control signals based on the particular voltage level. Alternatively, an estimated amount of current which should flow through the load 505 may be determined. The estimated common-mode voltage error is then equal to the difference between the voltage which the H-bridge circuit 500 should apply to the load 505 and a predetermined constant common-mode voltage. Similarly, the estimated common-mode current error is then equal to the difference between the current which should flow through the load 505 and a predetermined constant common-mode current.

Considering the digital signal output from the modulator 520, it should be recognized that the common-mode error determination circuit 550 can also function to pass the digital signal output from the modulator 520 to the H-bridge controller 510. Consequently, the common-mode error determination circuit 550 can provide both an error signal indicating an estimate of the common-mode voltage and/or current error of the H-bridge circuit 500 as well as the digital signal output from the modulator 520 to the H-bridge controller 510.

Figure 6A:
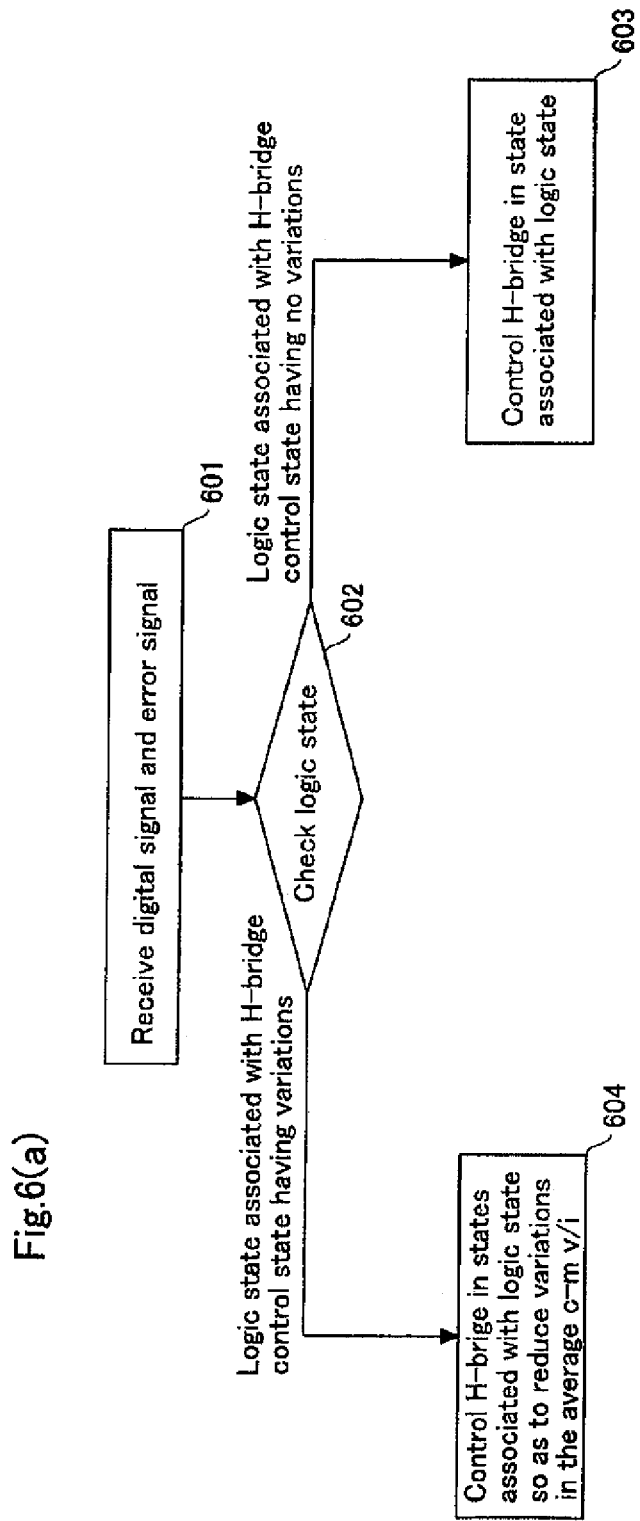
FIG. 6(a) illustrates a flow chart of the general logic operation of an H-bridge controller.
Figure 6B:
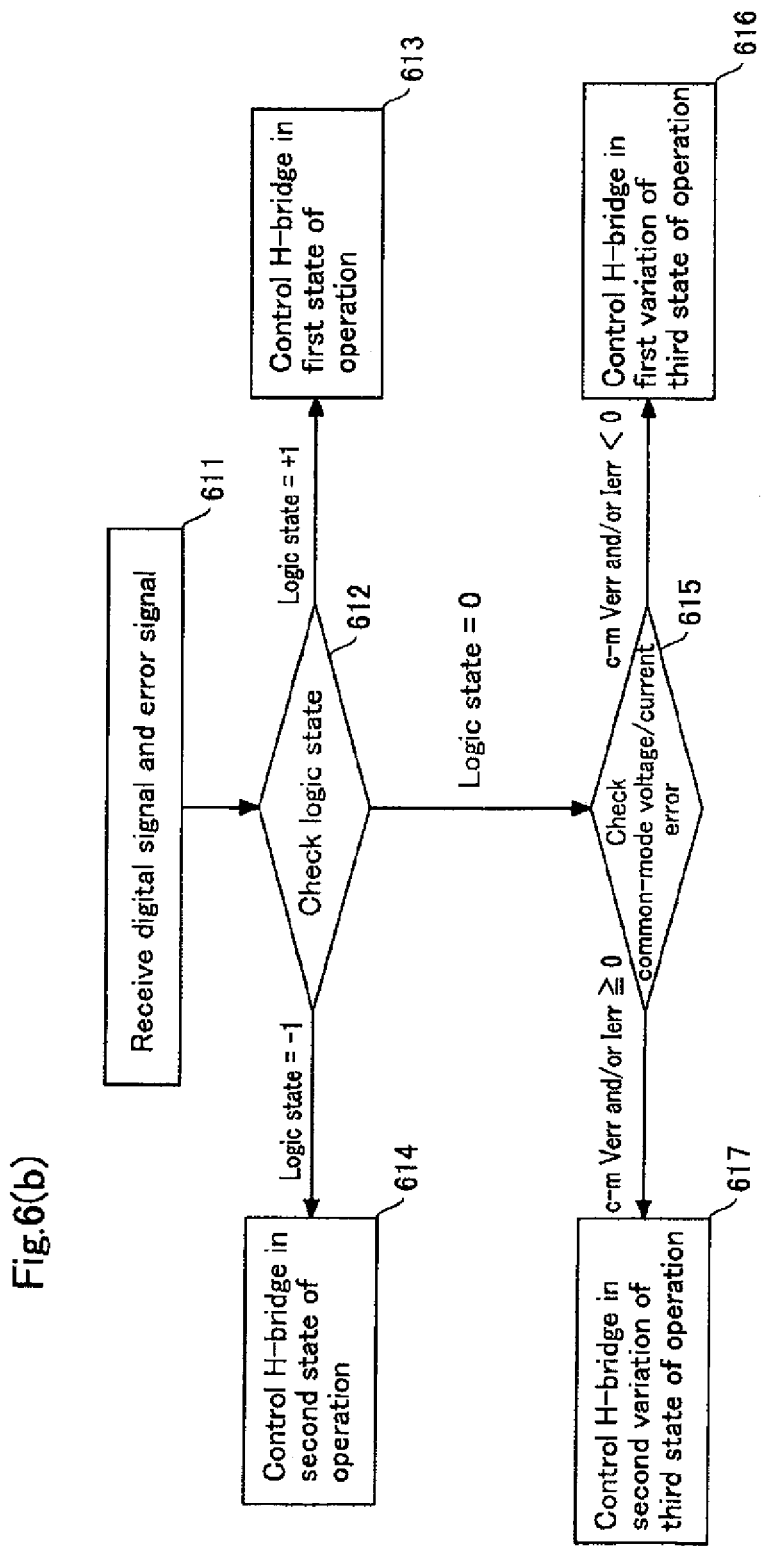
FIG. 6(b) illustrates a flow chart of the logic operation of an H-bridge controller in the case of a digital signal having voltage levels assigned to three logic states.

FIGS. 6(a)-(c) illustrate flowcharts of the logic operation of the H-bridge controller 310 illustrated in FIGS. 3(a) and 3(b). The logic operation illustrated in FIGS. 6(a)-(c) can equivalently be applied to the H-bridge controller 510 illustrated in FIG. 5.

FIG. 6(a) illustrates a flow chart of the general logic operation of the H-bridge controller 310. In step 601, the H-bridge controller 310 receives the digital signal from the modulator 320 and the error signal from the common-mode error determination circuit 340. In step 602, the H-bridge controller 310 checks the logic state assigned to the voltage level of the received digital signal.

If the logic state is associated with a state of operation of the H-bridge circuit 300 having no variations (i.e. the first and second states of operation) then the H-bridge controller 310 will control the H-bridge circuit 300 to operate in the state of operation associated with the logic state assigned to the voltage level of the received digital signal as illustrated in step 603.

If the logic state is associated with a state of operation of the H-bridge circuit 300 having a plurality of variations (i.e. the third state of operation) then the H-bridge controller 310 will control the H-bridge circuit 300 to operate in a plurality of states associated with the logic state assigned to the voltage level of the received digital signal that reduce variations in the average common-mode voltage and/or current of the H-bridge circuit 300 as illustrated in step 604.

FIG. 6(b) illustrates a flow chart of the logic operation of the H-bridge controller 310 in the case of the digital signal received from the modulator 320 having voltage levels assigned to three logic states. In step 611, the H-bridge controller 310 receives the digital signal from the modulator 320 and the error signal from the common-mode error determination circuit 340. In step 612, the H-bridge controller 310 checks the logic state assigned to the voltage level of the received digital signal.

If the logic state is equal to +1, the H-bridge controller 310 controls the H-bridge circuit 300 to operate in the first state of operation (illustrated in FIG. 2(b)) as shown in step 613. If the logic state is equal to −1, the H-bridge controller 310 controls the H-bridge circuit 300 to operate in the second state of operation (illustrated in FIG. 2(c)) as shown in step 614.

If the logic state is equal to 0, the H-bridge controller 310 checks the common-mode voltage and/or current error indicated by the received error signal as shown in step 615. If the common-mode voltage and/or current error is less than zero, the H-bridge controller 310 controls the H-bridge circuit 300 to operate in the first variation of the third state of operation (illustrated in FIG. 2(d)) as shown in step 616.

If the common-mode voltage and/or current error is greater than or equal to zero, the H-bridge controller 310 controls the H-bridge circuit 300 to operate in the second variation of the third state of operation (illustrated in FIG. 2(e)) as shown in step 617.

FIG. 6(c) illustrates a flow chart of the logic operation of the H-bridge controller 310 in the case of the digital signal received from the modulator 420 having voltage levels assigned to five logic states. The digital signal output from the modulator 320 may include a plurality of square pulses each having a predetermined period. In step 621, the H-bridge controller 310 receives the digital signal from the modulator 320 and receives the error signal from the common-mode error determination circuit 340. In step 622, the H-bridge controller 310 checks the logic state assigned to the voltage level of the received digital signal.

If the logic state is equal to +2, the H-bridge controller 310 controls the H-bridge circuit 300 to operate in the first state of operation (illustrated in FIG. 2(b)) for the predetermined period of the square pulse corresponding to the logic state equal to +2 as shown in step 623.

If the logic state is equal to −2, the H-bridge controller 310 controls the H-bridge circuit 300 to operate in the second state of operation (illustrated in FIG. 2(c)) for the predetermined period of the square pulse corresponding to the logic state equal to −2 as shown in step 624.

If the logic state is equal to 0, the H-bridge controller 310 checks the common-mode voltage and/or current error indicated by the received error signal as shown in step 625. If the common-mode voltage and/or current error is less than zero, the H-bridge controller 310 controls the H-bridge circuit 300 to operate in the first variation of the third state of operation (illustrated in FIG. 2(*d*)) for the predetermined period of the square pulse corresponding to the logic state equal to 0 as shown in step 626. If the common-mode voltage and/or current error is greater than or equal to zero, the H-bridge controller 310 controls the H-bridge circuit 300 to operate in the second variation of the third state of operation (illustrated in FIG. 2(*e*)) for the predetermined period of the square pulse corresponding to the logic state equal to 0 as shown in step 627.

If the logic state is equal to +1, the H-bridge controller 310 controls the H-bridge circuit 300 to operate in the first state of operation (illustrated in FIG. 2(*b*)) for a first half of the predetermined period of the square pulse corresponding to the logic state equal to +1 as shown in step 628. Either before or after step 628 the H-bridge controller 310 checks the common-mode voltage and/or current error indicated by the received error signal as shown in step 629. If the common-mode voltage and/or current error is less than zero, the H-bridge controller 310 controls the H-bridge circuit 300 to operate in the first variation of the third state of operation (illustrated in FIG. 2(*d*)) for a second half of the predetermined period of the square pulse corresponding to the logic state equal to +1 as shown in step 630. If the common-mode voltage and/or current is greater than or equal to zero, the H-bridge controller 310 controls the H-bridge circuit 300 to operate in the second variation of the third state of operation (illustrated in FIG. 2(*e*)) for the second half of the predetermined period of the square pulse corresponding to the logic state equal to +1 as shown in step 631.

If the logic state is equal to −1, the H-bridge controller 310 controls the H-bridge circuit 300 to operate in the second state of operation (illustrated in FIG. 2(*c*)) for a first half of the predetermined period of the square pulse corresponding to the logic state equal to −1 as shown in step 632. Either before or after step 632 the H-bridge controller 310 checks the common-mode voltage and/or current error indicated by the received error signal as shown in step 633. If the common-mode voltage and/or current error is less than zero, the H-bridge controller 310 controls the H-bridge circuit 300 to operate in the first variation of the third state of operation (illustrated in FIG. 2(*d*)) for a second half of the predetermined period of the square pulse corresponding to the logic state equal to −1 as shown in step 634. If the common-mode voltage and/or current is greater than or equal to zero, the H-bridge controller 310 controls the H-bridge circuit 300 to operate in the second variation of the third state of operation (illustrated in FIG. 2(*e*)) for the second half of the predetermined period of the square pulse corresponding to the logic state equal to −1 as shown in step 635.

Figure 7:
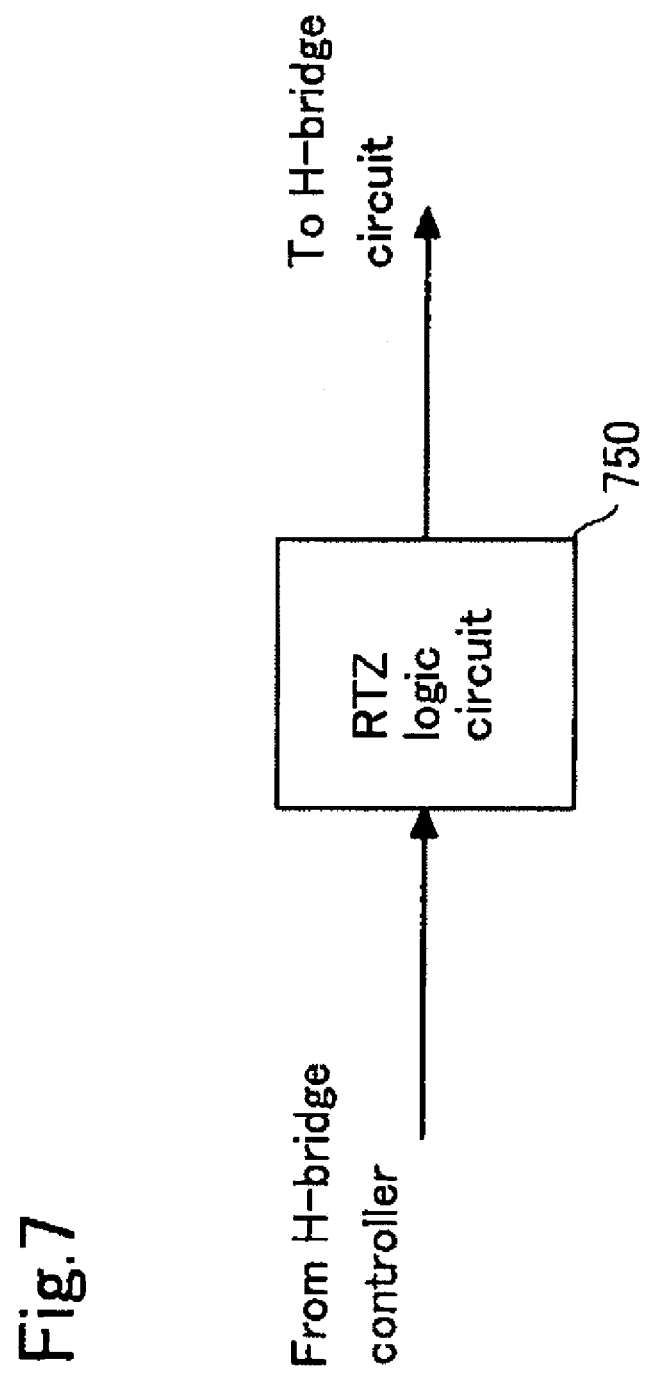
FIG. 7 illustrates a return-to-zero (RTZ) logic circuit.

FIG. 7 illustrates a return-to-zero (RTZ) logic circuit 750 for use in implementations having modulators that generate digital signals representing a number of logic states greater than three. These implementations include the embodiments illustrated in FIGS. 3 to 5.

The RTZ logic circuit 750 receives the control signals from the H-bridge controller 310, receives an activation signal from the H-bridge controller 310 and outputs modified control signals to the H-bridge circuit 300. Upon receipt of an activation signal, the RTZ logic circuit 750 functions to cause the common-mode voltage and/or current to return to a voltage and/or current corresponding to the logic state 0. The digital signal output from the modulator 320 may include a plurality of square pulses each having a predetermined period. In the case that an activation signal is not received, the output modified control signals are identical to the received control signals for the predetermined period. In the case that an activation signal is received, the output modified control signals will be identical to the received control signals for a first portion of the predetermined period of the square pulse associated with the logic state corresponding to the received control signals and modified to control the H-bridge circuit 300 in a state of operation corresponding to the logic state 0 for a second portion of the predetermined period.

The duration of the first and second portions is indicated by the activation signal. In the case that a plurality of variations exist for controlling the H-bridge circuit 300 to provide an analog output signal which is proportional to the logic state 0, the activation signal also indicates which of the plurality of variations is to be used for controlling the H-bridge circuit 300, 400.

Considering the flow chart of the logic operation of the H-bridge controller 310 illustrated in FIG. 6(*c*), the RTZ logic circuit 750 is activated in steps 630, 631, 634 and 635. In these cases, the activation signal indicates the duration of the first and second portions to be equal to one half of the predetermined period of the square pulse associated with the logic state corresponding to the received error signal, and indicates the variation of the state of operation that the H-bridge circuit 300 should be controlled in.

It should be recognized that the first and second portions are not limited to being the temporal first half and the temporal second half of the square pulse, respectively. Rather, the first and second portions may be any portion of the square pulse associated with the logic state corresponding to the received error signal.

Preferred applications of an apparatus and method for controlling a common-mode voltage and/or current of switching amplifiers in accordance with the invention are, for example, audio-related applications including driving speakers for home computers, portable computers, cellular telephones, vehicle stereo systems, and home audio systems.

The foregoing is merely illustrative of the principles of this invention and various modifications can be made by those skilled in the art without departing from the scope and spirit of the invention.

INDUSTRIAL APPLICABILITY

As described above, an H-bridge controller for controlling a common-mode voltage and/or current of an H-bridge circuit is provided. The H-bridge controller includes a section for receiving a digital signal, a section for receiving an error signal indicating an error of a common-mode voltage and/or current of the H-bridge circuit, and a section for generating control signals which control the H-bridge circuit to operate based on the received digital signal and the received error signal so as to reduce variations in the average common-mode voltage and/or current of the H-bridge circuit. Reducing variations in the average common-mode voltage and/or current of the H-bridge circuit reduces corruption of an output signal resulting from mismatches of the H-bridge circuit. The present invention also facilitates a reduction of variations in the average common-mode voltage and/or current while reducing the spatial requirements of the implementation of the required apparatus and method.

What is claimed is:

1. A system for controlling a common-mode voltage and/or current of an H-bridge circuit, comprising:
a modulator configured to receive an input signal, to modulate the received input signal, and to generate a digital signal having one of a plurality of voltage levels, the one voltage level selected based on the modulated received input signal, each of the plurality of voltage levels being assigned to a corresponding one of a plurality of logic states;
an H-bridge controller configured to receive the digital signal and to generate control signals for controlling operation of the H-bridge circuit;
an H-bridge circuit configured to receive the control signals and to operate based on the received control signals so as to output an analog signal to a load comprising a first terminal and a second terminal, wherein the H-bridge circuit comprises a plurality of states of operation including a first state of operation having a first variation and a second variation, a second state of operation, and a third state of operation, wherein the first and second variations are associated with different common-mode voltages of the H-bridge circuit, wherein the H-bridge circuit is configured to apply a first voltage to the first terminal and the second terminal of the load when the H-bridge circuit is in the first variation of the first state of operation, wherein the H-bridge circuit is configured to apply a second voltage to the first terminal and the second terminal of the load when the H-bridge circuit is in the second variation of the first state of operation, wherein the H-bridge circuit is configured to apply the first voltage to the first terminal of the load and the second voltage to the second terminal of the load when the H-bridge circuit is in the second state of operation, and wherein the H-bridge circuit is configured to apply the second voltage to the first terminal of the load and the first voltage to the second terminal of the load when the H-bridge circuit is in the third state of operation; and
a common-mode error determination circuit configured to generate an error signal indicating at least one of an error of a common-mode voltage or an error of a common-mode current of the H-bridge circuit,
wherein the H-bridge controller receives the error signal and generates the control signals based on the received digital signal and the received error signal, and wherein the H-bridge controller selectively controls the H-bridge circuit to operate in one of the first or second variations based on the error signal so as to reduce variations in at least one of an average of the common-mode voltage or an average of the common-mode current of the H-bridge circuit.

2. The system according to claim 1, wherein each of the plurality of states of operation is associated with a corresponding one of the plurality of logic states.

3. The system according to claim 1, wherein the received signal includes a plurality of square pulses each having a predetermined period, and the system further comprises: a return-to-zero logic circuit configured to receive the control signals from the H-bridge controller and to output modified control signals which cause the H-bridge circuit to operate in a state of operation associated with the logic zero for a portion of the predetermined time.

4. The system according to claim 1, wherein the modulator includes:
at least one integrator circuit, each integrator circuit configured to integrate the received input signal and to provide at least one integrated input signal;
a summation circuit coupled to the at least one integrator circuit, wherein the summation circuit is configured to receive the at least one integrated input signal from each integrator circuit and to sum the at least one received integrated input signal to provide a summed output; and
a quantizer coupled to the summation circuit, wherein the quantizer is configured to receive and to quantize the summed output so as to generate the digital signal.

5. The system according to claim 1, wherein
the H-bridge circuit includes two pairs of switches, the switches of each pair of switches being connected in series with one another between a voltage source and a ground.

6. The system according to claim 1, wherein the common-mode error determination circuit includes:
a common-mode voltage sensing and calculation circuit configured to sense the analog signal output to the load and to calculate a common-mode voltage and/or current error; and
an integrator circuit configured to integrate the calculated common-mode voltage and/or current error and to provide an integrated calculated common-mode voltage and/or current error as the error signal.

7. The system according to claim 1, wherein the common-mode error determination circuit includes:
a logic state detection and error estimation circuit configured to detect the logic state and to estimate a common-mode voltage and/or current error; and
an integrator circuit configured to integrate the estimated common-mode voltage and/or current error and to provide an integrated estimated common-mode voltage and/or current error as the error signal.

8. The system according to claim 1, wherein the common-mode error determination circuit includes:
a logic state detection and error estimation circuit configured to detect the logic state and to estimate a common-mode voltage and/or current error; and
a digital filter configured to filter the estimated common-mode voltage and/or current error and to provide a filtered estimated common-mode voltage and/or current error as the error signal.

9. The system according to claim 1, wherein the common-mode error determination circuit:
estimates a common-mode voltage and/or current based on the digital signal or information within the modulator;
calculates an estimated common-mode and/or current error based on the estimated common-mode voltage and/or current; and
provides the estimated common-mode and/or current error as the error signal.

10. The system according to claim 1, wherein:
the digital signal includes voltage levels assigned to three logic states or five logic states, and the modulator modulates the received input signal using either pulse width modulation or sigma delta modulation.

11. A method for controlling a common-mode voltage and/or current of an H-bridge circuit, the method comprising:
receiving an input signal, modulating the received input signal, and generating a digital signal having one of a plurality of voltage levels using a modulator, the one voltage level selected based on the modulated received input signal, each of the plurality of voltage levels being assigned to a corresponding one of a plurality of logic states;

receiving the digital signal and generating control signals for controlling operation of the H-bridge circuit using an H-bridge controller;

receiving the control signals and operating the H-bridge circuit based on the received control signals so as to output an analog signal to a load comprising a first terminal and a second terminal, wherein the H-bridge circuit comprises a plurality of states of operation including a first state of operation having a first variation and a second variation, a second state of operation, and a third state of operation, wherein the first and second variations are associated with different common-mode voltages of the H-bridge circuit, wherein the H-bridge circuit is configured to apply a first voltage to the first terminal and the second terminal of the load when the H-bridge circuit is in the first variation of the first state of operation, wherein the H-bridge circuit is configured to apply a second voltage to the first terminal and the second terminal of the load when the H-bridge circuit is in the second variation of the first state of operation, wherein the H-bridge circuit is configured to apply the first voltage to the first terminal of the load and the second voltage to the second terminal of the load when the H-bridge circuit is in the second state of operation, and wherein the H-bridge circuit is configured to apply the second voltage to the first terminal of the load and the first voltage to the second terminal of the load when the H-bridge circuit is in the third state of operation; and generating an error signal indicating at least one of an error of a common-mode voltage or an error of a common-mode current of the H-bridge circuit using a common-mode error determination circuit, wherein the H-bridge controller receives the error signal and generates the control signals based on the received digital signal and the received error signal, and wherein generating the control signals comprises selectively controlling the H-bridge circuit to operate in one of the first or second variations based on the error signal so as to reduce variations in at least one of an average of the common-mode voltage or an average of the common-mode current of the H-bridge circuit.

12. The method according to claim 11, wherein each of the plurality of states of operation is associated with a corresponding one of the plurality of logic states.

13. The method according to claim 11, wherein the received signal includes a plurality of square pulses each having a predetermined period, and the method further comprises:

receiving the control signals and outputting modified control signals using a return-to-zero logic circuit, wherein the modified control signals cause the H-bridge circuit to operate in a state of operation associated with the logic zero for a portion of the predetermined time.

14. The method according to claim 11, wherein modulating the received input signal includes:

integrating the received input signal and providing at least one integrated input signal using at least one integrator circuit;

receiving the at least one integrated input signal from each integrator circuit and summing the at least one received integrated input signal to provide a summed output using a summation circuit; and receiving and quantizing the summed output so as to generate the digital signal using a quantizer.

15. The method according to claim 11, wherein
the H-bridge circuit includes two pairs of switches, the switches of each pair of switches being connected in series with one another between a voltage source and a ground.

16. The method according to claim 11, wherein the common-mode error determination circuit includes a common-mode voltage sensing and calculation circuit and an integrator circuit, the method further comprising:

sensing the analog signal output to the load and calculating a common-mode voltage and/or current error using the common-mode voltage sensing and calculation circuit; and integrating the calculated common-mode voltage and/or current error and providing an integrated calculated common-mode voltage and/or current error as the error signal using the integrator circuit.

17. The method according to claim 11, wherein the common-mode error determination circuit includes a logic state detection and error estimation circuit and an integrator circuit, the method further comprising:

detecting the logic state and estimating a common-mode voltage and/or current error using the logic state detection and error estimation circuit; and integrating the estimated common-mode voltage and/or current error and providing an integrated estimated common-mode voltage and/or current error as the error signal using the integrator circuit.

18. The method according to claim 11, wherein the common-mode error determination circuit includes a logic state detection and error estimation circuit and a digital filter, the method further comprising:

detecting the logic state and estimating a common-mode voltage and/or current error using the logic state detection and error estimation circuit; and filtering the estimated common-mode voltage and/or current error and providing a filtered estimated common-mode voltage and/or current error as the error signal using the digital filter.

19. The method according to claim 11, further comprising the common-mode error determination circuit:

estimating a common-mode voltage and/or current based on the digital signal or information within the modulator;

calculating an estimated common-mode and/or current error based on the estimated common-mode voltage and/or current; and providing the estimated common-mode and/or current error as the error signal.

20. The method according to claim 11, wherein:
the digital signal includes voltage levels assigned to three logic states or five logic states, and the modulated input signal is modulated using either pulse width modulation or sigma delta modulation.

21. The method according to claim 11, wherein the error of the common-mode voltage is equal to a difference between an estimated common-mode voltage and a constant common-mode voltage, and wherein the error of the common-mode current is equal to a difference between an estimated common-mode current and a constant common-mode current.

22. The method according to claim 11, wherein the error of the common-mode voltage is equal to a difference between a sensed common-mode voltage and a constant common-mode voltage, and wherein the error of the common-mode current is equal to a difference between a sensed common-mode current and a constant common-mode current.

23. The system according to claim 1, wherein the error of the common-mode voltage is equal to a difference between an estimated common-mode voltage and a constant common-mode voltage, and wherein the error of the common-mode current is equal to a difference between an estimated common-mode current and a constant common-mode current.

24. The system according to claim 1, wherein the error of the common-mode voltage is equal to a difference between a sensed common-mode voltage and a constant common-mode voltage, and wherein the error of the common-mode current is equal to a difference between a sensed common-mode current and a constant common-mode current.

* * * * *